(12) United States Patent
Konno et al.

(10) Patent No.: US 8,957,667 B2
(45) Date of Patent: Feb. 17, 2015

(54) ELECTRIC CURRENT MEASURING APPARATUS

(75) Inventors: Yoshihiro Konno, Adachi-ku (JP); Masaru Sasaki, Adachi-ku (JP)

(73) Assignee: Adamant Kogyo Co., Ltd., Tokyo (JP)

( * ) Notice: Subject to any disclaimer, the term of this patent is extended or adjusted under 35 U.S.C. 154(b) by 430 days.

(21) Appl. No.: 13/321,396

(22) PCT Filed: May 18, 2010

(86) PCT No.: PCT/JP2010/003348
§ 371 (c)(1),
(2), (4) Date: Dec. 20, 2011

(87) PCT Pub. No.: WO2010/134327
PCT Pub. Date: Nov. 25, 2010

(65) Prior Publication Data
US 2012/0091991 A1    Apr. 19, 2012

(30) Foreign Application Priority Data

May 21, 2009   (JP) .................................. 2009-139634

(51) Int. Cl.
*G01R 19/00*   (2006.01)
*G01R 15/24*   (2006.01)
*G01R 19/32*   (2006.01)

(52) U.S. Cl.
CPC ............ *G01R 15/246* (2013.01); *G01R 15/245* (2013.01); *G01R 19/32* (2013.01)
USPC ............................................. 324/96; 324/97

(58) Field of Classification Search
CPC ..... G01R 15/245; G01R 15/246; G01R 19/32

USPC ....................................................... 324/96, 97
See application file for complete search history.

(56) References Cited

U.S. PATENT DOCUMENTS

| | | | | |
|---|---|---|---|---|
| 5,136,235 | A | * | 8/1992 | Brandle et al. .................. 324/96 |
| 5,640,516 | A | * | 6/1997 | Iwatsuka et al. ............. 359/280 |
| 6,055,081 | A | * | 4/2000 | Koyano et al. ................ 398/147 |

(Continued)

FOREIGN PATENT DOCUMENTS

| CA | 2 474 200 A1 | 9/2003 |
|---|---|---|
| JP | A-59-107273 | 6/1984 |

(Continued)

OTHER PUBLICATIONS

International Search Report issued in International Patent Application No. PCT/JP2010/003348 dated Aug. 3, 2012.

(Continued)

*Primary Examiner* — Huy Q Phan
*Assistant Examiner* — Adam Clarke
(74) *Attorney, Agent, or Firm* — Oliff PLC

(57) ABSTRACT

An electric measuring apparatus is constructed in such a way as to include a signal processing circuit equipped with at least a polarized light separating unit, Faraday rotators, a light source, a photoelectric conversion element, and optical fibers for a sensor. The optical fibers for the sensor are placed around the periphery of an electrical conductor through which electric current to be measured flows. Furthermore, the rotation angle of each Faraday rotator at the time when the magnetism of each Faraday rotator is saturated is set to 22.5°+ α° at a temperature of 23° C., thereby changing the rotation angle of each Faraday rotator by α° from 22.5°.

9 Claims, 14 Drawing Sheets

(56) References Cited

U.S. PATENT DOCUMENTS

| | | |
|---|---|---|
| 6,188,811 B1 * | 2/2001 | Blake .............................. 385/12 |
| 6,351,331 B1 | 2/2002 | Fukuda et al. |
| 7,176,671 B2 | 2/2007 | Kurosawa et al. |
| 2005/0083033 A1 | 4/2005 | Kurosawa et al. |
| 2007/0065156 A1 * | 3/2007 | Lin et al. ....................... 398/152 |
| 2007/0273358 A1 | 11/2007 | Kurosawa et al. |
| 2008/0030741 A1 | 2/2008 | Digonnet et al. |
| 2010/0253320 A1 | 10/2010 | Kurosawa |
| 2011/0141478 A1 * | 6/2011 | Sasaki et al. .................. 356/483 |

FOREIGN PATENT DOCUMENTS

| | | |
|---|---|---|
| JP | A-62-70776 | 4/1987 |
| JP | A-2-31171 | 2/1990 |
| JP | A-2001-51246 | 2/2001 |
| JP | A-2004-20348 | 1/2004 |
| RU | 2 120 128 C1 | 10/1998 |
| WO | WO 03/075018 A1 | 9/2003 |
| WO | WO 2006/022178 A1 | 3/2006 |
| WO | WO 2009/054157 A1 | 4/2009 |

OTHER PUBLICATIONS

Russian Office Action dated Apr. 23, 2014 from Russian Patent Application No. 2011152197 (with English-language translation).

International Preliminary Report on Patentability and Written Opinion of the International Searching Authority dated Aug. 3, 2010 from International Application No. PCT/JP2010/003348 (with English-language translation).

Russian Office Action dated Aug. 12, 2014 from Russian Patent Application No. 2011152197/28 (078318) (with English-language translation).

Kondo et al.; "A study on improvement of temperature dependence of an optical fiber current sensor;" *The 2009 Annual Meeting Record I.E.E. Japan*; Mar. 17, 2009; pp. 264-265 (with English-language translation).

Notification of Reasons for Rejection dated Aug. 27, 2014 from Japanese Patent Application No. 2009-139634 (with English-language translation).

* cited by examiner

US 8,957,667 B2

ELECTRIC CURRENT MEASURING APPARATUS

TECHNICAL FIELD

The present invention relates to an electric current measuring apparatus using the Faraday effect, and in particular, to a reflective electric current measuring apparatus in which light is incident to one end of an optical fiber for a sensor and reflected from the other end thereof.

BACKGROUND OF THE INVENTION

An electric current measuring apparatus is known in which the Faraday effect of the optical fiber is used and which has various advantages, such as a small size, flexibility, electromagnetic noise resistance, long-distance signal transmission, and a withstand voltage, and the like. As an example of the electric current measuring apparatus, Patent document 1 discloses a reflective electric current measuring apparatus which uses the Faraday effect, that is, uses the rotation of the polarization plane of light by the action of a magnetic field.

FIG. 21 shows an electric current measuring apparatus 100 shown in FIG. 18 of Patent document 1, WO 2006/022178 (the reference numerals in the drawings of Patent document 1 are changed for description hereinafter). The electric current measuring apparatus 100 is a reflective electric current measuring apparatus 100 which uses a lead-glass fiber as an optical fiber 101 for a sensor, and a mirror 102 is disposed at the other end of the optical fiber 101 for a sensor. The optical fiber 101 for a sensor is provided the around the periphery of an electrical conductor 103, through which an electric current to be measured flows, to detect the measured electric current. Basically, while linearly polarized light incident from one end of the optical fiber 101 for a sensor is reciprocating by the mirror 102, the Faraday rotation angle of linearly polarized light rotating by the magnetic field of the measured electric current is detected.

Reference numeral 104 represents a light source, reference numeral 105 represents a circulator, reference numeral 106 represents a polarization separating unit, such as calcite, reference numeral 107 represents a Faraday rotator having a permanent magnet 107a and a ferromagnetic crystal 107b such as YIG, reference numerals 108a and 108b represent photodiodes (PD), reference numerals 109a and 109b represent amplifiers (A), reference numerals 110a and 110b represent band pass filters (BPF), reference numerals 111a and 111b represent low pass filters (LPF), reference numerals 112a and 112b represent dividers for obtaining the ratio of an alternating current component and a direct current component of an electrical signal, reference numeral 113 represents a polarity inverter, and reference numeral 114 represents a multiplier. Reference numeral 115 represents an optical system, and reference numeral 116 represents a signal processing circuit.

Of linearly polarized light which is emitted from the light source 104 and separated into an ordinary ray and an extraordinary ray by the polarization separating unit 106, linearly polarized light corresponding to the ordinary ray passes through the ferromagnetic crystal 107b and is then incident on the optical fiber 101 for a sensor. Light is reflected by the mirror 102, passes through the optical fiber 101 for a sensor and the ferromagnetic crystal 107b again, and is incident on the polarization separating unit 106.

The polarization plane of linearly polarized light rotates when linearly polarized light passes through the ferromagnetic crystal 107b and the optical fiber 101 for a sensor. Thus, linearly polarized light is separated into polarized light components in two orthogonal directions by the polarization separating unit 106. The separated polarized light components are respectively guided to light receiving elements 108a and 108b serving as photodiodes by the circulator 105 and the polarization separating unit 106 of FIG. 21.

A current or voltage proportional to the intensity of received light is output from each of the photodiodes 108a and 108b as an electrical signal. The electrical signals pass through the amplifiers 109a and 109b, and are then separated into an alternating current component and a direct current component by the BPFs 110a and 110b and the LPFs 111a and 111b. The ratio of the alternating current component and the direct current component is obtained by the dividers 112a and 112b. With regard to an output signal from the divider 112a, the polarity is inverted by the polarity inverter 113. The average of signals Sa and Sb output from the polarity inverter 113 and the divider 112b is obtained by the multiplier 114, and the average is output as the measurement value Sout of the measured electric current of the electric current measuring apparatus 100.

As the Faraday rotator 107 provided on the optical fiber 101 for a sensor, a Faraday rotator having the Faraday rotation angle of 22.5° at the time of magnetic saturation is used (for example, see Patent document 2, WO 2003/075018).

CITATION LIST

Patent Documents

Patent document 1: WO 2006/022178 (pages 4-7, FIG. 18)
Patent document 2: WO 2003/075018 (page 8, FIG. 1)

SUMMARY OF THE INVENTION

Problems to be Solved by the Invention

However, the Faraday rotation angle of the Faraday rotator 107 used in the electric current measuring apparatus has a characteristic (temperature characteristic) depending on ambient temperature. Accordingly, in the Faraday rotator 107 of the related art, in order to reduce the temperature characteristic of the Faraday rotator 107, as shown in FIG. 21, the signal processing circuit 116 and the photoelectric conversion element (photodiodes 108a and 108b) are duplexed, and the average of the two modulated signals Sa and Sb is obtained, thereby reducing the influence on the output Sout resulting from the temperature dependency of the Faraday rotational capability of the ferromagnetic Faraday rotator 107.

The optical fiber 101 for a sensor also has the temperature characteristic of the ratio error resulting from the temperature dependency of the Verdet's constant and the Faraday rotation angle. Thus, it is necessary to perform not only the compensation in the Faraday rotator 107 but also the compensation for (reduction in) the temperature characteristic of the optical fiber 101 for a sensor. Although the compensation in the Faraday rotator 107 and the optical fiber 101 for a sensor is performed by the signal processing circuit 116, it is not perfect. From the viewpoint of the improvement in reliability of the electric current measuring apparatus 100, there is demand for compensation in the optical system 115.

FIG. 22a shows the relation between the error rate of the modulated signals Sa and Sb and the temperature in FIG. 21. FIG. 22b shows the temperature characteristic of the optical fiber 101 for a sensor. That is, as shown in FIG. 22a, even when the process of averaging the modulated signals Sa and Sb is performed, there remains the problem shown in FIG.

22*b*, that is, the problem in that, when the optical fiber 101 for a sensor is a lead-glass fiber, it is difficult to fully compensate for the temperature characteristic of the sensor output due to the temperature dependency of the Verdet's constant of the optical fiber 101 for a sensor.

Thus, there is a demand for the electric current measuring apparatus 100 which fully compensates for the temperature characteristics of both of the Faraday rotator 107 and the optical fiber 101 for a sensor. In particular, from the viewpoint of the application to a protection relay, it is necessary that the fluctuation range of a ratio error in the measurement value Sout of the electric current 103 to be measured output from the signal processing circuit 116 is suppressed to be within ±0.5%.

An electric current measuring apparatus of the invention has been made on the basis of the above-described problem, and an object of the invention is to provide an electric current measuring apparatus which can perform the compensation for the temperature characteristic of a ratio error of an optical fiber for a sensor and a Faraday rotator by an optical system of the electric current measuring apparatus.

An object of the invention is to set the fluctuation range of a ratio error in the output of the electric current measuring apparatus within ±0.5%.

Means to Solve the Problems

An electric current measuring apparatus according to claim 1 of the invention includes a signal processing circuit which includes at least an optical fiber for a sensor, a polarization separating unit, a Faraday rotator, a light source, and a photoelectric conversion element. The optical fiber for sensor is provided around the periphery of an electrical conductor through which an electric current to be measured flows, and has one end at which linearly polarized light is incident and the other end at which the incident linearly polarized light is reflected, the polarization separating unit is provided at one end of the optical fiber for a sensor, the Faraday rotator is disposed between one end of the optical fiber for a sensor and the polarization separating unit, and the Faraday rotation angle of the Faraday rotator at the time of magnetic saturation is set to degrees of 22.5°+α° at a temperature of 23° C., such that the fluctuation range of a ratio error in a measurement value of a measured electric current output from the signal processing circuit is set within a range of ±0.5%.

According to claim 2 of the invention, in the electric current measuring apparatus of claim 1, a temperature range in which the fluctuation range is set within a range of ±0.5% is 100 degrees in the centigrade, i.e. Celsius scale.

According to claim 3 of the invention, in the electric current measuring apparatus of claim 2, the temperature range of 100 degrees in the Celsius scale refers to the range between −20° C. or higher and 80° C. or lower.

According to claim 4 of the invention, in the electric current measuring apparatus of any one of claims 1 to 3, the Faraday rotator has the temperature characteristic of the Faraday rotation angle such that the Faraday rotation angle at the time of magnetic saturation changes in a quadratic curve shape in accordance with a change in temperature.

According to claim 5 of the invention, in the electric current measuring apparatus of any one of claims 1 to 4, the Faraday rotator has two or more Faraday elements.

According to claim 6 of the invention, in the electric current measuring apparatus of claim 5, the Faraday rotation angles of the two or more Faraday elements are different from each other.

According to claim 7 of the invention, in the electric current measuring apparatus of any one of claims 4 to 6, the fluctuation range of the ratio error in the measurement value of the measured electric current output from the signal processing circuit is set within a range of ±0.2%.

According to claim 8 of the invention, in the electric current measuring apparatus of claim 7, a temperature range in which the fluctuation range is set within a range of ±0.2% is 100 degrees in the Celsius scale.

According to claim 9 of the invention, in the electric current measuring apparatus of claim 8, the temperature range of 100 degrees in the Celsius scale is the range between −20° C. or higher and 80° C. or lower.

According to claim 10 of the invention, in the electric current measuring apparatus of any one of claims 1 to 9, the optical fiber for sensor is a lead-glass fiber.

Effects of the Invention

With the electric current measuring apparatus according to claim 1 of the invention, the rotation angle of the Faraday rotator at the temperature of 23° C. is changed by α° from 22.5° to reduce the fluctuation range of the ratio error of the Faraday rotator, so that the fluctuation range of the ratio error in the measurement value of the measured electric current output from the signal processing circuit is suppressed to be within ±0.5%. Therefore, it becomes possible to perform the compensation for the temperature characteristic of the ratio error in the measurement value by an optical system, called the Faraday rotator, thereby improving the reliability of the electric current measuring apparatus and suppressing the fluctuation range of the ratio error to be within ±0.5%. As a result, it is possible to realize an electric current measuring apparatus which can be applied to a protection relay.

With the electric current measuring apparatus according to any one of claims 2 and 3, or claims 8 and 9, the ratio error fluctuation range of ±0.5% or ±0.2% is realized through the temperature range of 100 degrees in the Celsius scale (the range between −20° C. or higher and 80° C. or lower), making it possible to constitute an electric current measuring apparatus which has practicality to cover the normal temperature range between −10° C. or higher and 40° C. or lower.

With the electric current measuring apparatus according to claims 4 to 7, the Faraday rotator is provided to have the temperature characteristic of the Faraday rotation angle in which the Faraday rotation angle at the time of magnetic saturation changes in a quadratic curve shape depending on an increase in temperature, thereby making it possible to set the fluctuation range of the ratio error in the measurement value of the measured electric current output from the signal processing circuit within ±0.5% or ±0.2%. Therefore, in addition to the purpose within ±0.5%, it becomes possible to use the electric current measuring apparatus for the purpose of requiring the temperature characteristic of the ratio error within ±0.2% (for example, an electric energy meter for measuring an electric rate).

With the electric current measuring apparatus according to claim 5, it is possible to stably obtain a Faraday rotator having a desired rotation angle. With the electric current measuring apparatus according to claim 6, it becomes possible to make a configuration such that the Faraday rotation angles of the Faraday elements are different from each other, thereby setting the temperature characteristic of each Faraday element to a desired characteristic.

With the electric current measuring apparatus according to claim 10, since a lead-glass fiber is used as the optical fiber for a sensor, when reducing the fluctuation range of the ratio error of the electric current measuring apparatus, after the temperature characteristic of the ratio error of the lead-glass fiber is added, the rotation angle α° of the Faraday rotator is adjusted. With this configuration of the electric current measuring apparatus, even when a lead-glass fiber is used as the optical fiber for a sensor, it becomes possible to suppress the fluctuation range of the ratio error in the measurement value of the measured electric current output from the signal processing circuit to be within ±0.5% (or ±0.2).

DETAILED DESCRIPTION OF THE PREFERRED EMBODIMENTS

Figure 1:
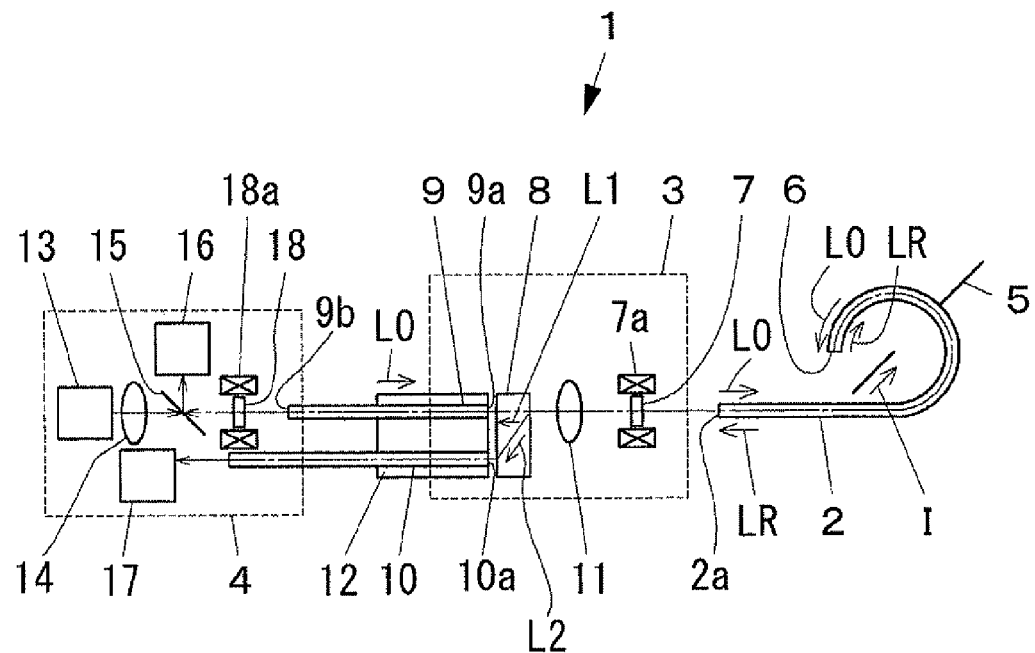
FIG. 1 is a configuration diagram illustrating the best mode of an electric current measuring apparatus according to the present invention.

Hereinafter, the preferred embodiment of the invention will be described with reference to FIGS. 1 to 8. FIG. 1 is a configuration diagram illustrating the best mode of an electric current measuring apparatus 1 according to the invention. The electric current measuring apparatus 1 shown in FIG. 1 includes an optical fiber 2 for a sensor, a polarized light separator 8, a Faraday rotator 7, a light source 13, and a signal processing circuit (not shown) described below.

The optical fiber 2 for a sensor is provided around the periphery of an electrical conductor 5 through which an electric current I to be measured flows. The optical fiber 2 for a sensor is constituted by a lead-glass fiber through which linearly polarized light LO and linearly polarized light LR reflected from the other end of the optical fiber 2 for sensor propagate. A reflecting film 6 is provided as a reflective material at the other end of the optical fiber 2 for a sensor. In addition to the reflecting film 6, an arbitrary reflective material may be used. For example, a mirror made of a metal having low absorptance and high reflectance, such as gold, silver, copper, chromium, or aluminum, or a dielectric multilayer film may be provided.

The optical circuit unit 3 is a circuit in which linearly polarized light of one of an ordinary ray and an extraordinary ray is incident on the optical fiber 2 for a sensor, and in order to detect the Faraday rotation angle of the polarization plane of linearly polarized light emitted from the optical fiber 2 for a sensor, linearly polarized light emitted from the optical fiber for a sensor is separated into the ordinary ray and the extraordinary ray. The optical circuit unit 3 includes a Faraday rotator 7 (hereinafter, called as the first Faraday rotator 7), a birefringent element 8 (hereinafter, called as a polarization separating unit 8) serving as a polarization separating unit, a first optical fiber 9, a second optical fiber 10, and a lens 11.

The first Faraday rotator 7 is a light transmissive optical element which has a permanent magnet 7a on the periphery thereof, is formed of bismuth-substituted garnet single crystal, and is provided near one end 2a serving as the incident end of the optical fiber 2 for a sensor. The first Faraday rotator 7 rotates the polarization planes of incident linearly polarized light LO and reflected linearly polarized light LR by the Faraday rotation angle by magnetic saturation. Thus, when there is no influence of the electric current I to be measured, the polarization plane of linearly polarized light LO prior to transmitting the first Faraday rotator 7 and the polarization plane of linearly polarized light LR after having transmitted the first Faraday rotator 7 rotate by two times greater than the Faraday rotation angle, 45° in total. The purpose that the polarization plane of linearly polarized light rotates by 45° is to separate linearly polarized light LR into an ordinary ray L1 and an extraordinary ray L2 in the polarization separating unit 8, to obtain the Faraday rotation angle of linearly polarized light LO or LR by the ordinary ray L1 and the extraordinary ray L2, and to calculate the value of the electric current I to be measured from the Faraday rotation angle.

Figure 2:
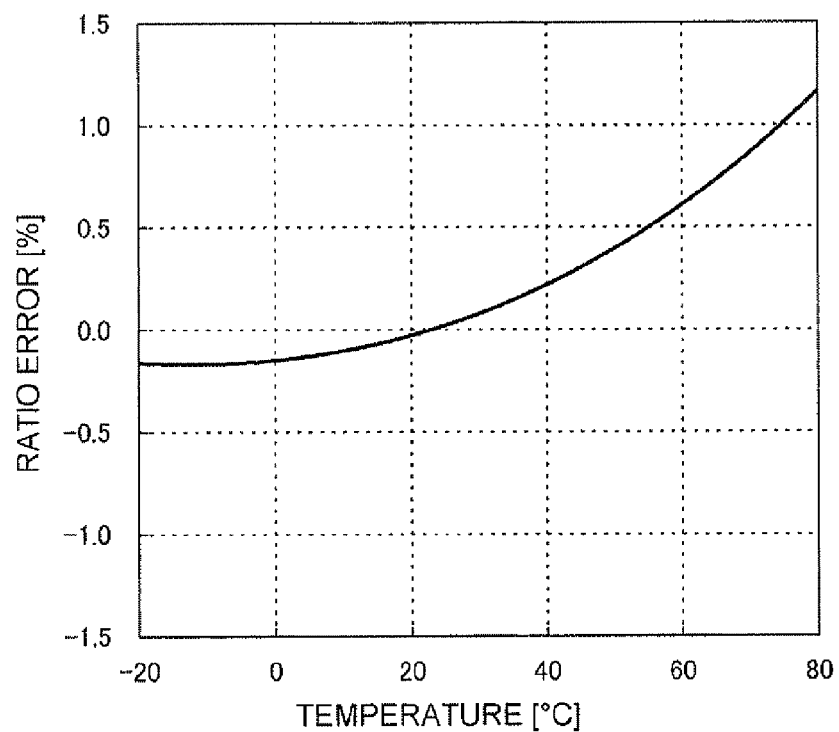
FIG. 2 is a graph schematically illustrating the temperature characteristic of the ratio error in the temperature range of −20° C. or higher and 80° C. or lower in an electric current measuring apparatus which includes a Faraday rotator having a Faraday rotation angle of 45° at a temperature of 23° C. when linearly polarized light transmits in a reciprocating manner.

In the invention, the total Faraday rotation angle at the time of magnetic saturation when linearly polarized light LO and LR transmit in a reciprocating manner is set so as to slightly change from 45° at the temperature of 23° C. The reason for defining the temperature of the Faraday rotation angle at 23° C. is that the applicant has set the temperature to a temperature such that the Faraday rotation angle can be simplest measured at normal temperature. Accordingly, the Faraday rotation angle when linearly polarized light LO or LR transmits the first Faraday rotator 7 once becomes 22.5°+a slight change of $\alpha°$. FIG. 2 is a graph schematically illustrating the ratio error-temperature characteristic in the temperature range of −20° C. or higher and 80° C. or lower in the measurement value of the measures electric current output from the signal processing circuit of the electric current measuring apparatus which has the Faraday rotation angle of 45° at the temperature of 23° C. when linearly polarized light transmits in a reciprocating manner. The reason for defining the temperature range to be 100 degrees in the Celsius scale, which is the temperature within the range between −20° C. or higher and 80° C. or lower, resides in the request from the customer of the applicant.

Figure 3:
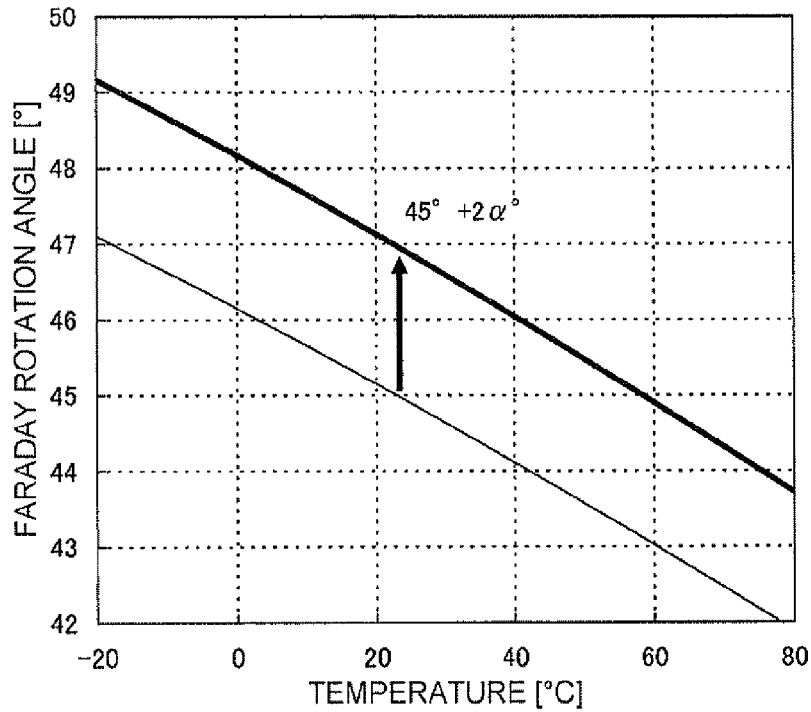
FIG. 3 is a graph schematically illustrating the temperature dependency of a Faraday rotation angle when the Faraday rotation angle at a temperature of 23° C. changes by α° from 22.5° and light transmits in a reciprocating manner.
Figure 4:
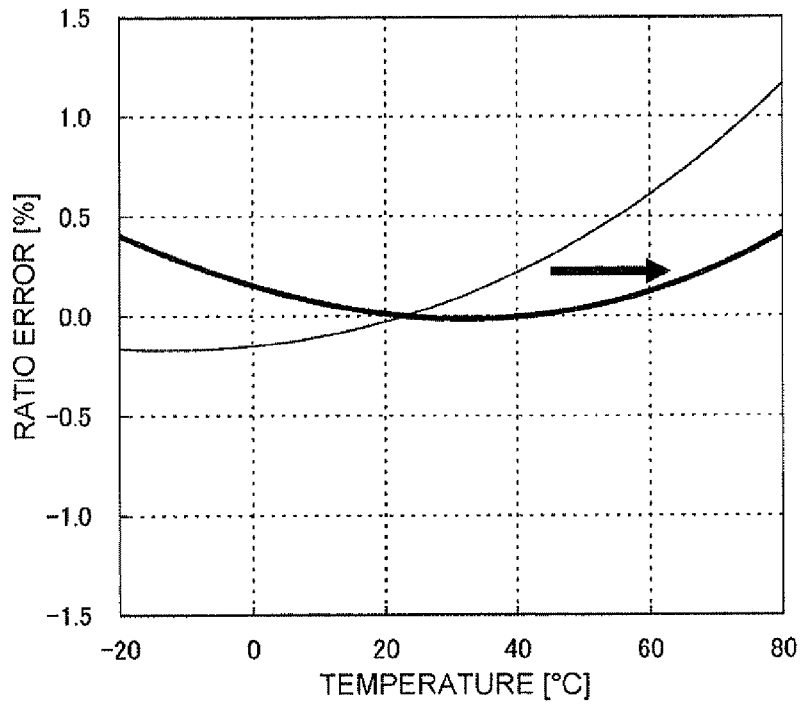
FIG. 4 is a graph schematically illustrating the temperature characteristic of the ratio error in the temperature range of −20° C. or higher and 80° C. or lower in an electric current measuring apparatus which includes a Faraday rotator in which Faraday rotation angle changes by α° from 22.5° and the curve of the temperature characteristic of a ratio error is shifted to a high-temperature side.

As shown in FIG. 2, as the temperature increases, the ratio error of the electric current measuring apparatus increases nonlinearly. In the temperature characteristic of the ratio error, the Faraday rotation angle at the temperature of 23° C. is set so as to change by a slight rotation angle $\alpha°$ from 22.5°, so that, as shown in FIG. 3, the rotation angle becomes 45°+2$\alpha°$ in a reciprocating manner. Thus, as shown in FIG. 4, the curve of the temperature characteristic of the ratio error of the electric current measuring apparatus is shifted to the high-temperature side. As a result, as will be understood by comparison of FIGS. 2 and 4, it becomes possible to the decrease the fluctuation range of the ratio error. When the curve of the temperature characteristic of the ratio error is shifted, the rotation angle $\alpha°$ can be arbitrarily set within the range in which the fluctuation range of the ratio error decreases. In this way, the basic concept of the invention resides in that the Faraday rotation angle changes by $\alpha°$ from 22.5° to decrease the fluctuation range of the ratio error of the electric current measuring apparatus.

The polarization separating unit 8 is a light transmissive optical element, and is provided on the photoelectric conversion unit 4 of the first Faraday rotator 7 near one end 2a serving as the incident end of the optical fiber 2 for a sensor. Accordingly, the Faraday rotator 7 is disposed between one end 2a of the optical fiber 2 for a sensor and the polarization separating unit 8. As described above, the polarization separating unit 8 is constituted by the birefringent element. The polarization separating unit 8 has a function as a polarization separating element which directly transmits linearly polarized light when linearly polarized light is incident perpendicularly to the crystal axis, and moves in parallel and emits linearly polarized light when linearly polarized light is incident along the crystal axis. With regard to linearly polarized light incident on the polarization plane other than the two orthogonal planes, light intensity is separated into vector components. Then, the ordinary ray directly transmits, and the extraordinary ray moves in parallel and is emitted. Thus, the polarization separating unit 8 has a function of separating linearly polarized light LR from the optical fiber 2 for a sensor into the ordinary ray L1 and the extraordinary ray L2 perpendicular to each other, and transmitting linearly polarized light LO emitted from the light source 13 described below.

The material of the polarization separating unit 8 can be selected from a group including rutile, YVO4, lithium niobate, and calcite. The birefringent element selected from these materials is processed in a flat plate having a predetermined thickness such that opposing optical surfaces for light incidence and emission face each other, and becomes the polarization separating unit 8. The polarization separating unit 8 is disposed such that one of the parallel optical surfaces faces the end surfaces 9a and 10a of the first optical fiber 9 and the second optical fiber 10, and the other optical surface faces the lens 11. In the polarization separating unit 8, if linearly polarized light LR is incident from one optical surface, linearly polarized light LR is separated into the ordinary ray L1 and the extraordinary ray L2, and when being emitted from the other plane, the ordinary ray L1 and the extraordinary ray L2 are emitted in parallel at a predetermined separation interval.

The first optical fiber 9 is constituted by a polarization preserving fiber, and the end surface 9a at one end is disposed near the polarization separating unit 8. Alternatively, the end surface 9a may be disposed to be in contact with the polarization separating unit 8. As a result, the first optical fiber 9 has a function of allowing linearly polarized light LO to be incident on the polarization separating unit 8 and allowing the ordinary ray L1 emitted from the polarization separating unit 8 to propagate toward the photoelectric conversion unit 4.

The second optical fiber 10 is constituted by a single-mode optical fiber, a multimode optical fiber, a polarization maintaining fiber, or the like, and the end surface 10a at one end is disposed near the polarization separating unit 8. Alternatively, the end surface 10a may be disposed to be in contact with the polarization separating unit 8. As a result, the second optical fiber 10 has a function of allowing the extraordinary ray L2 emitted from the polarization separating unit 8 to propagate toward the photoelectric conversion unit 4.

In this embodiment, the first and second optical fibers 9 and 10 are configured such that the end surfaces 9a and 10a at one end are disposed on the same plane and held by a ferrule 12 having a dual-core structure at a predetermined interval. The predetermined interval is set in accordance with the thickness of the polarization separating unit 8 having a parallel plate shape and the property of the selected material. The predetermined interval is aligned with the separation interval of the polarization separating unit 8, thereby allowing the ordinary ray L1 and the extraordinary ray L2 to be incident on the cores of the optical fibers 9 and 10. The means for holding the first and second optical fibers 9 and 10 at the predetermined interval is not limited to the ferrule 12. For example, an array substrate may be used in which two parallel V-shaped grooves are provided and the optical fibers 9 and 10 are disposed in the V-shaped grooves, so that the optical fibers 9 and 10 are positioned.

In this embodiment, the lens 11 is constituted by a single lens and disposed between the first Faraday rotator 7 and the polarization separating unit 8. Each imaging point is set to each core of one end 2a of the optical fiber 2 for a sensor and the end surface 9a of the first optical fiber 9. In this embodiment, each of one end 2a of the optical fiber 2 for a sensor and one end surface 9a of the first optical fiber 9 is an upright surface perpendicular to the optical axis, so that the imaging point of the lens 11 is set on the substantial center of the core of each fiber.

Figure 23:
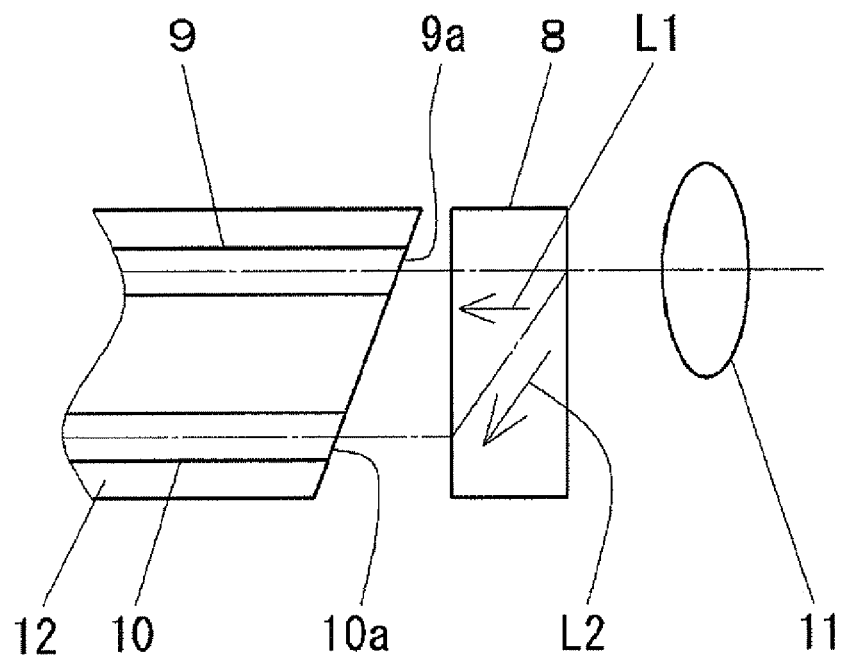
FIG. 23 is a partial schematic view illustrating a modification of the end surface shape of each of a first optical fiber and a second optical fiber.

As shown in FIG. 23, the end surfaces 9a and 10a may be changed to be subjected to an oblique polishing process. In this way, if the end surfaces 9a and 10a are obliquely formed, the positions of the end surfaces 9a and 10a are aligned with the focal length of the lens 11 for each of the ordinary ray L1 and the extraordinary ray L2, making it possible to improve the coupling efficiency of the first optical fiber 9 and the second optical fiber 10.

The photoelectric conversion unit 4 includes a light source 13, a lens 14, a polarization separating prism 15, two first and second photoelectric conversion elements 16 and 17, and a second Faraday rotator 18. The light source 13 is constituted by a semiconductor laser (LD), a light emitting diode (LED), a super luminescent diode (SLD), an ASE light source, or the like, and emits light having a predetermined wavelength λ. The lens 14 is provided in front of the light source 13, combines light emitted from the light source 13, and allows light to be incident on the polarization separating prism 15. The polarization separating prism 15 linearly polarizes light emitted from the light source 13 and combines linearly polarized light with the optical fiber 9, and also reflects the ordinary ray L1 serving as emitted light emitted from the first optical fiber 9 to the first photoelectric conversion element 16. The first and second photoelectric conversion elements 16 and 17 are constituted by photodiodes (PD) or the like, and receive light and convert light to an electrical signal.

The second Faraday rotator 18 is a light transmissive optical element which has a permanent magnet 18a on the periphery thereof, is formed of bismuth-substituted garnet single crystal, and is provided in front of the polarization separating prism 15 to rotate incident linearly polarized light by 45°. In this way, the purpose that the second Faraday rotator 18 which rotates linearly polarized light by 45° is provided is to rotate the polarization plane of returning linearly polarized light L1 in the reverse direction by 90° with respect to the polarization plane of linearly polarized light LO in the forward direction, so that linearly polarized light L1 is reflected by the polarization separating prism 15 to be incident on the first photoelectric conversion element 16.

The other end 9b of the first optical fiber 9 is disposed closely in front of the second Faraday rotator 18. Emitted light from the second optical fiber 10 is incident on the second photoelectric conversion element 17.

The operation of the electric current measuring apparatus 1 configured as above will be described with reference to FIGS. 1, 5a to 5d, and 6a to 6e. FIGS. 5a to 5d are explanatory diagrams illustrating the polarization state of light until reaching the reflecting film 6 from the light source 13. FIGS. 6a to 6e are explanatory diagrams illustrating the polarization state of light until being reflected by the reflecting film 6 and reaching the first and second photoelectric conversion elements 16 and 17. Light (see FIG. 5a) emitted from the light source 13 transmits the lens 14 and the polarization separating prism 15, and becomes linearly polarized light. Linearly polarized light LO (see FIG. 5b) is incident on the second Faraday rotator 18 and then incident on the first optical fiber 9 as linearly polarized light LO (see FIG. 5c) whose polarization plane is rotated by 45°.

The first optical fiber 9 is a polarization preserving fiber or the like, such that linearly polarized light LO propagates through the first optical fiber 9 in a state where the polarization plane is preserved, and is incident on the polarization separating unit 8. The direction of the crystal axis on the optical surface of the polarization separating element 8 is set to be perpendicular to the polarization plane of linearly polarized light LO emitted from the first optical fiber 9. Thus, linearly polarized light LO incident on the polarization separating unit 8 transmits the polarization separating unit 8 as the ordinary ray without causing birefringence, and is emitted from the polarization separating unit 8 in the polarization state when being incident on the polarization separating unit 8.

Figure 5A:
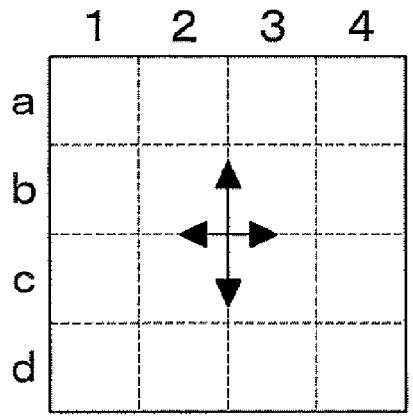
FIG. 5a is an explanatory diagram illustrating the polarization state of light until reaching a reflecting film from a light source in the electric current measuring apparatus of FIG. 1.
Figure 5B:
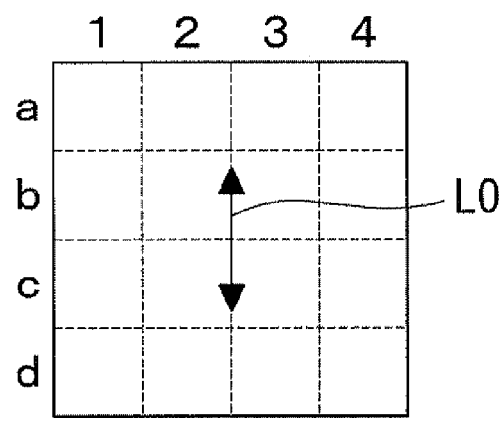
FIG. 5b is an explanatory diagram illustrating the polarization state of light until reaching a reflecting film from a light source in the electric current measuring apparatus of FIG. 1.
Figure 5C:
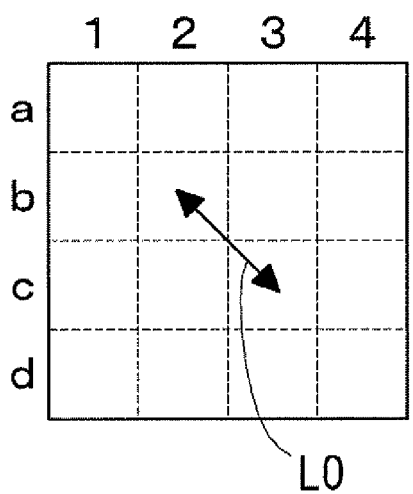
FIG. 5c is an explanatory diagram illustrating the polarization state of light until reaching a reflecting film from a light source in the electric current measuring apparatus of FIG. 1.
Figure 5D:
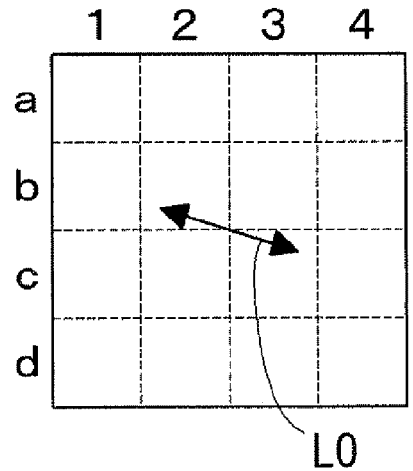
FIG. 5d is an explanatory diagram illustrating the polarization state of light until reaching a reflecting film from a light source in the electric current measuring apparatus of FIG. 1.

The polarization plane of linearly polarized light LO emitted from the polarization separating unit 8 is rotated by 22.5°+α° when transmitting the first Faraday rotator 7 after having transmitted the lens 11 (see FIG. 5d). As described above, linearly polarized light LO is incident on one end 2a of the optical fiber 2 for a sensor by the action of the lens 11.

Linearly polarized light LO incident on the optical fiber 2 for a sensor propagates through the optical fiber 2 for a sensor, reaches the other end, is reflected by the reflecting film 6, and returns to one end 2a again. While linearly polarized light LO and LR propagate in a reciprocating manner by the reflection, linearly polarized light LO and LR are influenced by a magnetic field according to the electric current I to be measured, and the polarization planes thereof rotate by an angle θ° corresponding to the magnitude of the electric current I to be measured by the Faraday effect. θ° is the Faraday rotation angle depending on the intensity of the magnetic field by the electric current I to be measured when linearly polarized light LO and LR reciprocate in the optical fiber 2 for a sensor.

The polarization plane of linearly polarized light LR (see FIG. 6a) emitted from one end 2a is rotated by 22.5°+α° again when transmitting the first Faraday rotator 7 (see FIG. 6b), transmits the lens 11, and is incident on the polarization separating unit 8. Thus, the polarization plane of linearly polarized light LR after having transmitted the first Faraday rotator 7 is rotated by an angle of (45°+2α°+θ°) with respect to the polarization plane of linearly polarized light LO prior to transmitting the first Faraday rotator 7.

As described above, the polarization plane of linearly polarized light LR incident on the polarization separating unit 8 is shifted by (45°+2α°+θ°) with respect to the polarization plane of linearly polarized light LO prior to transmitting the first Faraday rotator 7. For this reason, linearly polarized light LR is separated into the ordinary ray L1 and the extraordinary ray L2 having the orthogonal polarization planes in the polarization separating unit 8 (see FIG. 6c). The ordinary ray L1 is emitted along a surface perpendicular to a surface including the crystal axis and the optical axis of the polarization separating unit 8, and the extraordinary ray L2 is emitted from the polarization plane which vibrates within the surface including the crystal axis and the optical axis (see FIG. 6d). If the rotation of the polarization planes of linearly polarized light LO and LR occurs due to the electric current I to be measured, the light amount of each of the ordinary ray L1 and the extraordinary ray L2 changes at the time of separation. Thus, the rotation of the polarization plane is detected as the change in the light intensity by each of the photoelectric conversion elements 16 and 17.

Figure 6A:
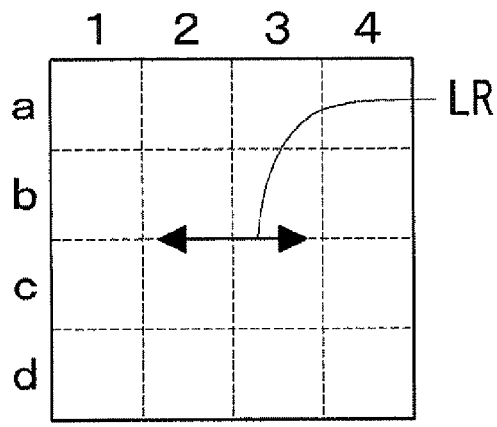
FIG. 6a is an explanatory diagram illustrating the polarization state of light until being reflected by a reflecting film and reaching first and second photoelectric conversion elements in the electric current measuring apparatus of FIG. 1.
Figure 6B:
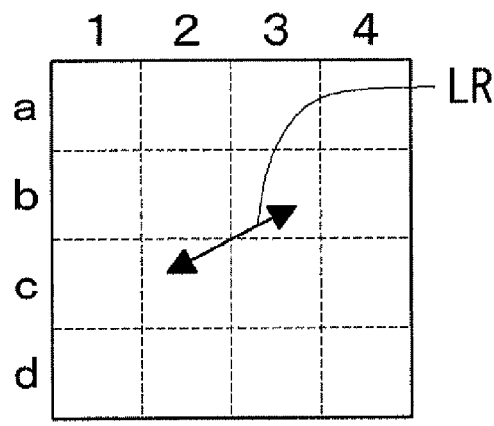
FIG. 6b is an explanatory diagram illustrating the polarization state of light until being reflected by a reflecting film and reaching first and second photoelectric conversion elements in the electric current measuring apparatus of FIG. 1.
Figure 6C:
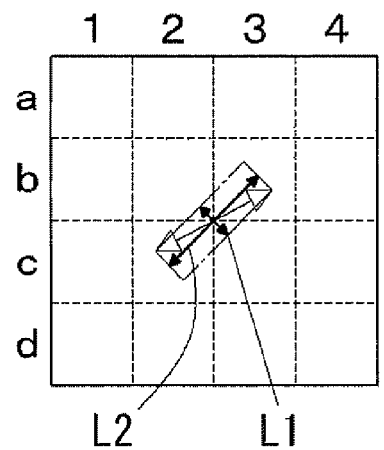
FIG. 6c is an explanatory diagram illustrating the polarization state of light until being reflected by a reflecting film and reaching first and second photoelectric conversion elements in the electric current measuring apparatus of FIG. 1.
Figure 6D:
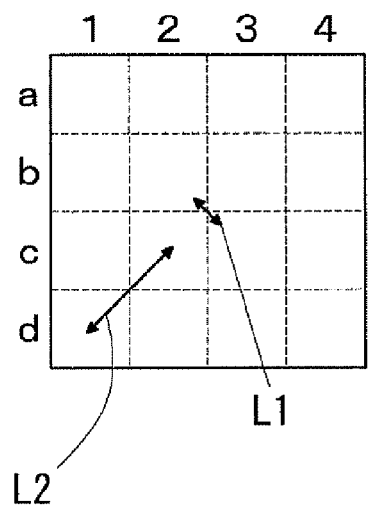
FIG. 6d is an explanatory diagram illustrating the polarization state of light until being reflected by a reflecting film and reaching first and second photoelectric conversion elements in the electric current measuring apparatus of FIG. 1.
Figure 6E:
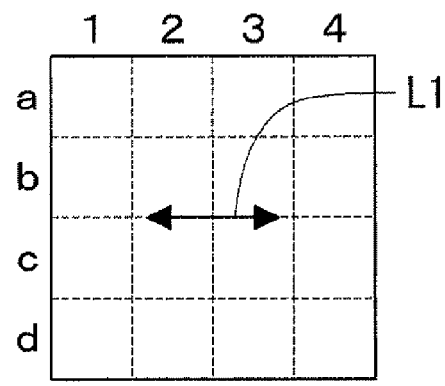
FIG. 6e is an explanatory diagram illustrating the polarization state of light until being reflected by a reflecting film and reaching first and second photoelectric conversion elements in the electric current measuring apparatus of FIG. 1.

The ordinary ray L1 emitted from the polarization separating unit 8 is incident on the first optical fiber 9 from the end surface 9a, and is guided to the photoelectric conversion unit 4 and the signal processing circuit, undergoes the rotation of the polarization plane by 45° in the second Faraday rotator 18 (see FIG. 6e. In order to ensure ease of understanding, FIG. 6e shows the ordinary ray L1 on a magnified scale), and is incident on the polarization separating prism 15. The polarization plane of the ordinary ray L1 incident on the polarization separating prism 15 is perpendicular to the polarization plane of linearly polarized light LO having emitted from the light source 13 and transmitted the polarization separating prism 15 (see FIGS. 5b and 6e). Thus, the ordinary ray L1 is reflected by the polarization separating prism 15 and received by the first photoelectric conversion element 16.

The extraordinary ray L2 is incident on the second optical fiber 10 from the end surface 10a, guided to the photoelectric conversion unit 4 and the signal processing circuit, and received by the second photoelectric conversion element 17.

Figure 7:
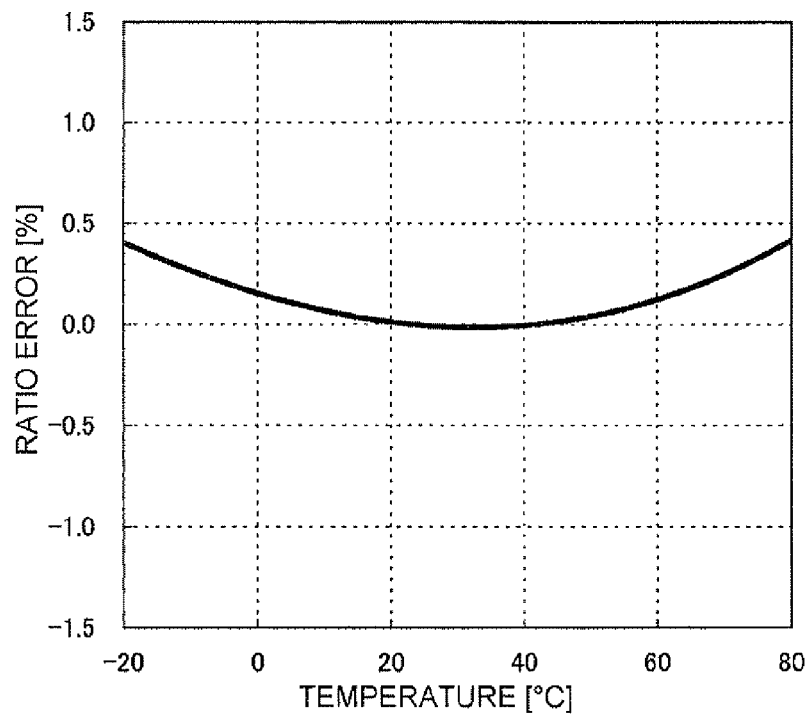
FIG. 7 is a graph illustrating an example of the temperature characteristic of the ratio error in the measurement value of an measured electric current output from a signal processing circuit in the electric current measuring apparatus of FIG. 1.
Figure 21:
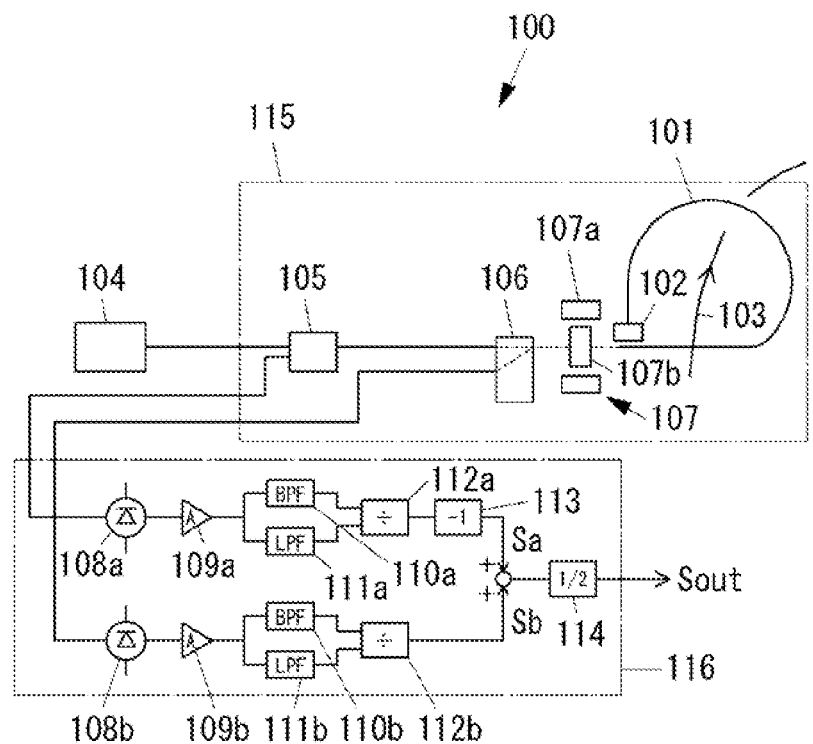
FIG. 21 is a configuration diagram illustrating an electric current measuring apparatus of the related art.
Figure 22A:
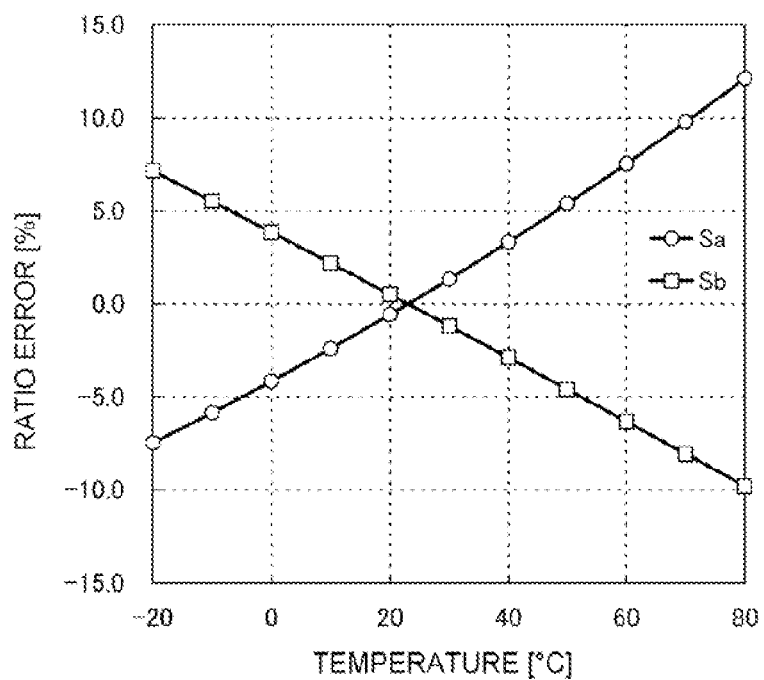
FIG. 22a is a graph illustrating the relation between the error rate of the modulation degree and the temperature of the electric current measuring apparatus of FIG. 21, and the temperature characteristic of the ratio error of an optical fiber for a sensor.
Figure 22B:
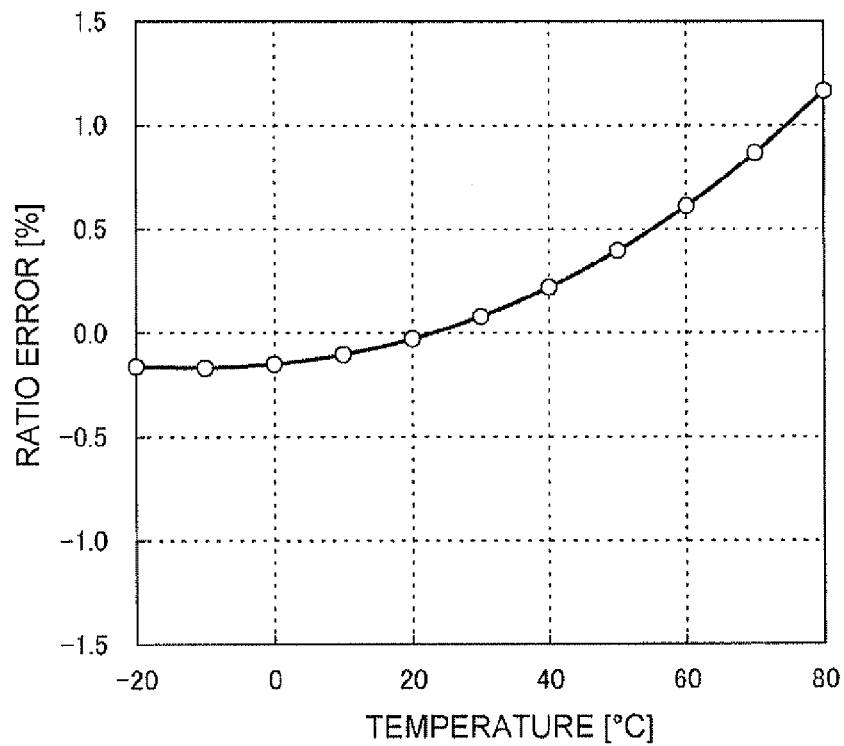
FIG. 22b is a graph illustrating the relation between the error rate of the modulation degree and the temperature of the electric current measuring apparatus of FIG. 21, and the temperature characteristic of the ratio error of an optical fiber for a sensor.

The electrical signals converted by the photoelectric conversion elements 16 and 17 are input to, for example, a signal processing circuit 116 (a photodiode 108a is substituted with the photoelectric conversion element 16, and a photodiode 108b is substituted with the photoelectric conversion element 17) shown in FIG. 21. The average of the degrees of modulation (alternating current component/direct current component) of the two current signals detected by the first photoelectric conversion element 16 and the second photoelectric conversion element 17 is calculated. Finally, linearly polarized light LR is converted to the electric quantity, thereby obtaining the magnitude of the electric current I to be measured. FIG. 7 shows an example of the temperature characteristic curve of the ratio error in the measurement value of the electric current I to be measured output from the signal processing circuit in the electric current measuring apparatus 1.

In the invention, as shown in FIG. 7, it is assumed that the fluctuation range of the ratio error in the measurement value of the electric current I to be measured output from the signal processing circuit is set within a range of ±0.5%. It is also assumed that ±0.5% is realized through the temperature range of 100 degrees in the Celsius scale (between −20° C. or higher and 80° C. or lower). The reason for setting the temperature range to be 100 degrees in the Celsius scale, which is the temperature within the range between −20° C. or higher and 80° C. or lower, resides in that practicality to cover the normal temperature range, which ranges from −10° C. to 40° C., is taken into consideration. In the invention, as described above, the setting of the fluctuation range of the ratio error within ±0.5% is performed by adjusting the rotation angle of the first Faraday rotator 7.

Figure 8:
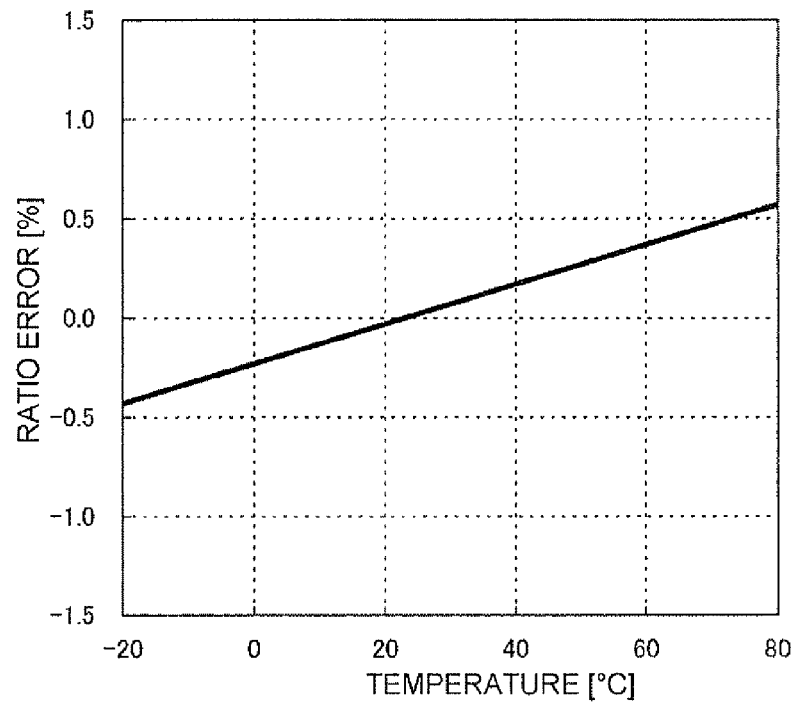
FIG. 8 is a graph schematically illustrating the temperature characteristic of the ratio error of a lead-glass fiber which is used as an optical fiber for a sensor.

A lead-glass fiber which is used as the optical fiber 2 for a sensor has the temperature characteristic of the ratio error shown in FIG. 8. Accordingly, when the rotation angle of the first Faraday rotator 7 changes by α° from 22.5° to reduce the fluctuation range of the ratio error of the electric current measuring apparatus 1, it should suffice that, after the temperature characteristic of the ratio error of the lead-glass fiber is added, the angle of α° is adjusted such that the fluctuation range of the ratio error in the measurement value of the electric current I to be measured output from the signal processing circuit falls within ±0.5 through the temperature range between −20° C. or higher and 80° C. or lower.

Figure 9:
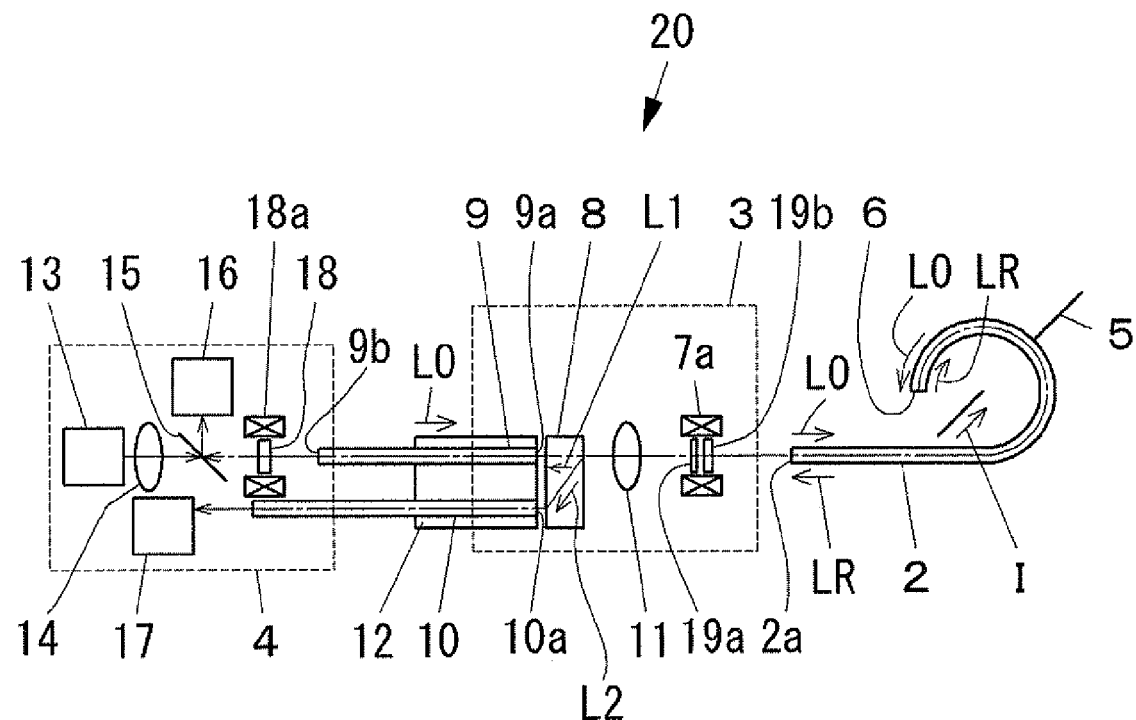
FIG. 9 is a configuration diagram illustrating another mode of an electric current measuring apparatus according to the invention.

As shown in FIG. 9, the electric current measuring apparatus 1 shown in FIG. 1 may be changed to an electric current measuring apparatus 20 in which the first Faraday rotator 7 is constituted by, for example, two Faraday elements 19a and 19b having different Faraday rotation angles. In the electric current measuring apparatus 20, the total Faraday rotation angle at the time of magnetic saturation when linearly polarized light LO and LR transmit the two Faraday elements 19a and 19b in a reciprocating manner is set to slightly change from 45°. That is, the sum of the Faraday rotation angles when linearly polarized light LO and LR respectively transmit the two Faraday elements 19a and 19b once may change to 22.5°+slight change α°. The number of Faraday elements is not limited to two, and the first Faraday rotator 7 may be constituted by three or more Faraday elements.

Figure 10:
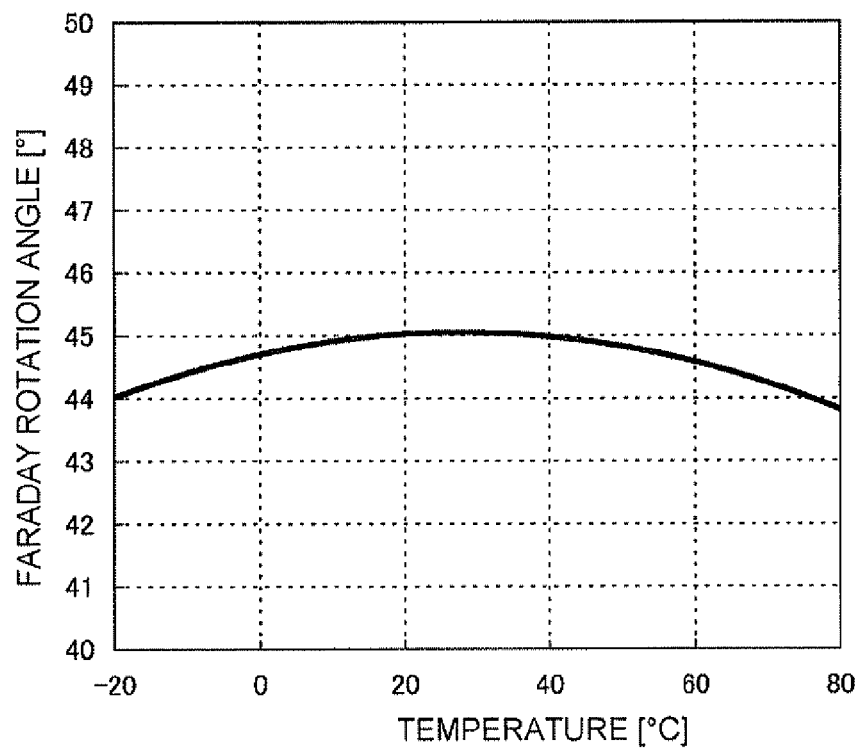
FIG. 10 is a graph schematically illustrating the temperature characteristic of a Faraday rotation angle of a first Faraday element.
Figure 11:
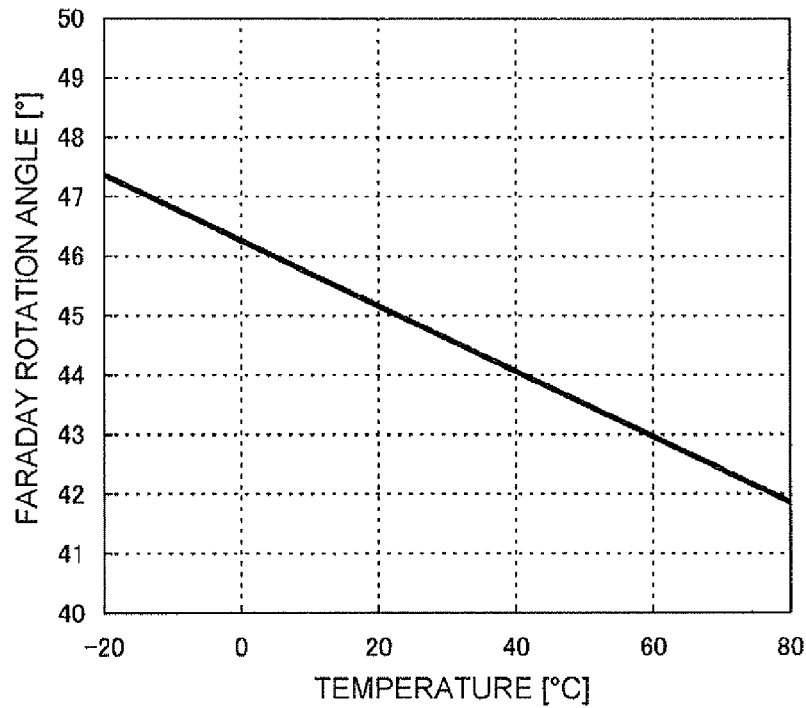
FIG. 11 is a graph schematically illustrating the temperature characteristic of a Faraday rotation angle of a second Faraday element.
Figure 12:
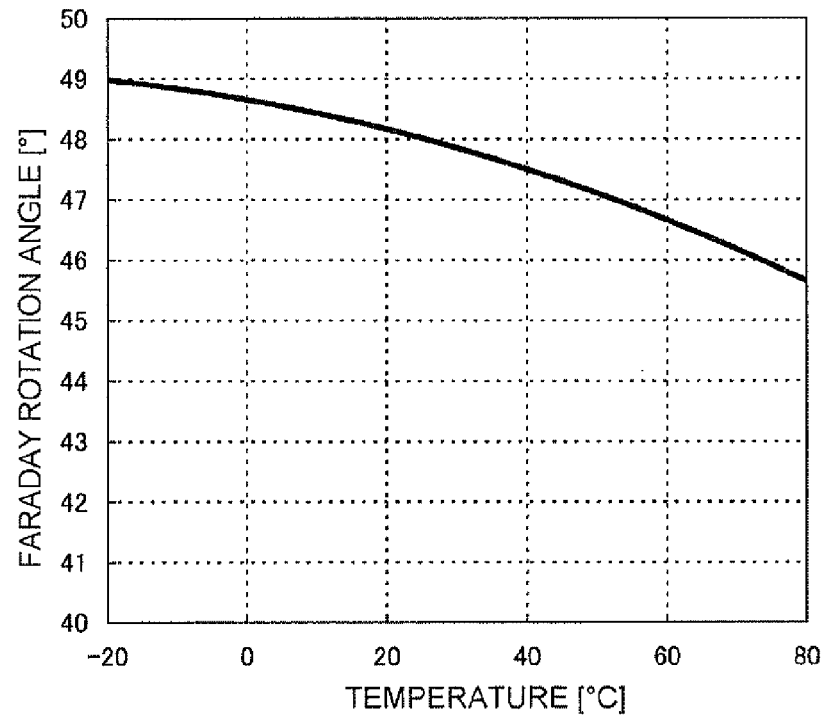
FIG. 12 is a graph illustrating the temperature characteristic of the ratio error in which the temperature characteristics of the Faraday rotation angle shown in FIGS. 9 and 10 are combined.

FIGS. 10 and 11 are graphs schematically illustrating the temperature characteristics of the Faraday rotation angles of the Faraday elements 19a and 19b. FIG. 12 shows the temperature characteristic of the Faraday rotation angle when the temperature characteristics of the Faraday rotation angles of the Faraday elements are combined. As shown in FIG. 10, the rotation angle of the first Faraday element 19a has temperature dependency in a quadratic curve shape. As shown in FIG. 11, it is understood that the rotation angle of the second Faraday element 19b uniformly decrease in inverse proportion to an increase in temperature through the temperature range between −20° C. or higher and 80° C. or lower. Accordingly, if the temperature characteristics of the Faraday rotation angles of the first Faraday element 19a and the second Faraday element 19b are combined, the temperature characteristic of the Faraday rotation angle shown in FIG. 12 which decreases in a quadratic curve shape with respect to an increase in temperature is shown.

Figure 13:
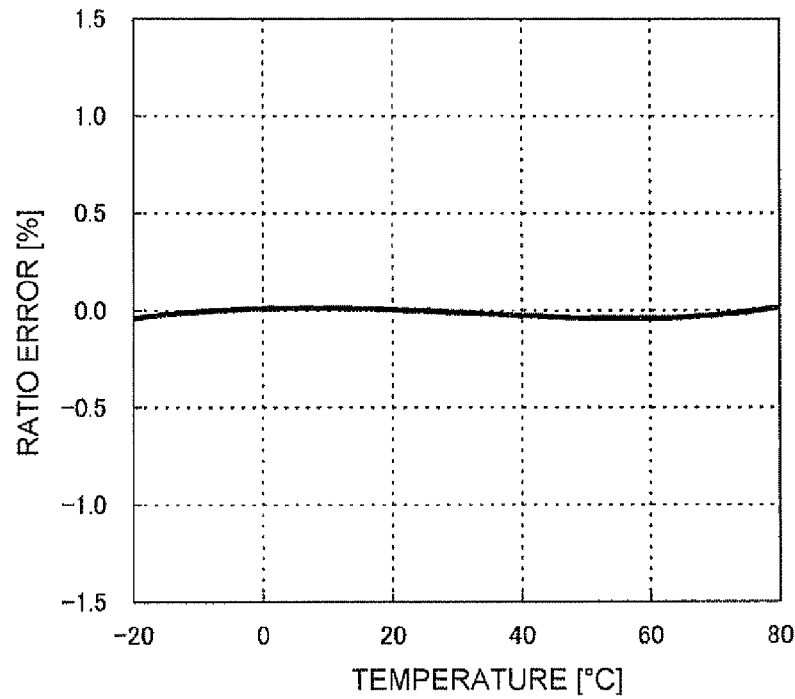
FIG. 13 is a graph illustrating an example of the temperature characteristic of the ratio error of an electric current measuring apparatus in the measurement value of an measured electric current which is obtained from the temperature dependency of the Faraday rotation angle shown in FIG. 12.

As shown in FIG. 8, the temperature characteristic of the ratio error of the lead-glass fiber which is used as the optical fiber 2 for a sensor uniformly increases in proportion to an increase in temperature. Accordingly, if the decrease in the Faraday rotation angle in the high-temperature range is provided in the Faraday elements 19a and 19b, when the temperature characteristic of the ratio error of the lead-glass fiber which is used as the optical fiber 2 for a sensor is added, the decrease in the Faraday rotation angle in the high-temperature range compensates for the change in the ratio error of the lead-glass fiber. Thus, as shown in FIG. 13, it becomes possible to suppress the fluctuation range of the ratio error in the measurement value of the electric current I to be measured output from the signal processing circuit to be within ±0.5 (or ±0.2%) through the temperature range between −20° C. or more and 80° C. or lower.

By the configuration comparison of the electric current measuring apparatus 1 and the electric current measuring apparatus 20, in the electric current measuring apparatus 1, the single first Faraday rotator 7 can be used. Thus, it is possible to simplify the configuration of the electric current measuring apparatus as much, and it becomes easy to adjust the fluctuation range of the ratio error in the measurement value of the electric current I to be measured output from the signal processing circuit. For the above-described reasons, the electric current measuring apparatus 1 is the most preferred embodiment. However, when it is difficult to stably create garnet single crystal having a desired rotation angle due to the composition of garnet of the first Faraday rotator 7, the first Faraday rotator 7 may be constituted by two or more Faraday elements. When the first Faraday rotator 7 is constituted by two or more Faraday elements, the Faraday rotation angles of the Faraday elements are different from each other, thereby setting the temperature characteristic of each Faraday element to a desired characteristic.

Hereinafter, Examples 1 to 3 in which an optimum rotation angle is set with respect to the temperature dependency of the first Faraday rotator 7 or the Faraday elements 19a and 19b, and a variation in the ratio error is suppressed.

EXAMPLE 1

Figure 14:
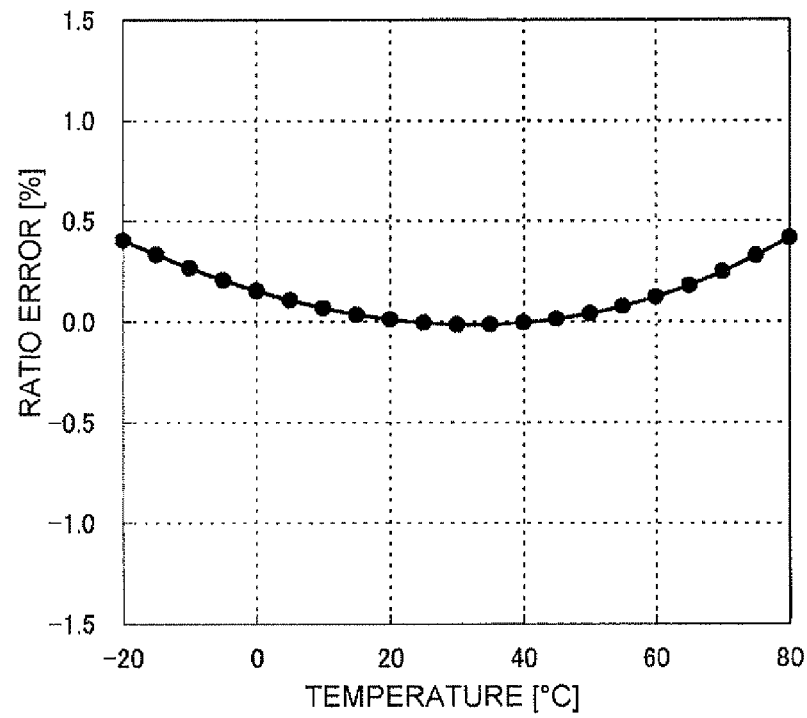
FIG. 14 is a graph illustrating the temperature characteristic of the ratio error in Example 1 of the electric current measuring apparatus of the invention.

An example will be described where magnetic garnet which is used in an optical isolator and has the temperature characteristic of the Faraday rotation angle shown in FIG. 11 is used as the first Faraday rotator 7 of FIG. 1. A Faraday rotator having a Faraday rotation angle of 22.5°+1.0° at the temperature of 23° C. was used. That is, α=1.0° was set, and the total Faraday rotation angle at the time of magnetic saturation when linearly polarized light LO and LR transmit in a reciprocating manner was set to 47.0°. Table 1 and FIG. 14 show the temperature characteristic of the ratio error in the measurement value of the electric current I to be measured output from the signal processing circuit of the electric current measuring apparatus 1 having the first Faraday rotator 7. In Table 1, "Faraday rotation angle" is the total Faraday rotation angle at the time of magnetic saturation when linearly polarized light LO and LR transmit in a reciprocating manner, and "ratio error" is the ratio error in the measurement value of the electric current I to be measured output from the signal processing circuit of the electric current measuring apparatus 1. Hereinafter, the same is applied to Examples 2 and 3.

TABLE 1

| Temperature T [° C.] | Rotation Angle [deg] | Ratio Error [%] |
| --- | --- | --- |
| −20 | 49.21 | 0.40 |
| −15 | 48.96 | 0.33 |
| −10 | 48.72 | 0.27 |
| −5 | 48.47 | 0.21 |
| 0 | 48.21 | 0.15 |
| 5 | 47.96 | 0.11 |
| 10 | 47.70 | 0.07 |
| 15 | 47.44 | 0.04 |
| 20 | 47.17 | 0.01 |
| 25 | 46.91 | −0.01 |
| 30 | 46.63 | −0.01 |
| 35 | 46.36 | −0.01 |
| 40 | 46.08 | −0.01 |
| 45 | 45.80 | 0.01 |
| 50 | 45.52 | 0.04 |
| 55 | 45.24 | 0.08 |
| 60 | 44.95 | 0.12 |
| 65 | 44.66 | 0.18 |
| 70 | 44.36 | 0.25 |
| 75 | 44.06 | 0.33 |
| 80 | 43.76 | 0.42 |

From Table 1 and FIG. 14, it is understood that, when the number of first Faraday rotators is one, and α=1.0° is set, the ratio error can fall within −0.01 to 0.42% from 23° C. That is, the fluctuation range of the ratio error falls within 0.43% through the temperature range between −20° C. or higher and 80° C. or lower.

EXAMPLE 2

The rotation angle-temperature dependency of magnetic garnet in a reciprocating manner was expressed by the following quadratic expression (Equation 1), the minimum value of the ratio error fluctuation range for a coefficient a and a coefficient b was calculated. A coefficient c was set such that the ratio error fluctuation range has the minimum value. The relation between the ratio error fluctuation range and the coefficients a and b is shown in Table 2. As shown in Table 2, the relation between the adjustment amount α° of the Faraday rotation angle at the temperature of 23° C. and the coefficients a and b when the ratio error fluctuation range has the minimum value is shown in Table 3.

$$\theta_F = a \cdot T^2 + b \cdot T + c \qquad \text{[Equation 1]}$$

in which T is temperature [° C.].

TABLE 2

| Ratio Error | Secondary Coefficient a | | | | | | | | | | |
| --- | --- | --- | --- | --- | --- | --- | --- | --- | --- | --- | --- |
| Fluctuation Range | −0.0005 | −0.0004 | −0.0003 | −0.0002 | −0.0001 | 0.0000 | 0.0001 | 0.0002 | 0.0003 | 0.0004 | 0.0005 |
| Primary Coefficient b  −0.06 | 1.12% | 0.98% | 0.86% | 0.73% | 0.64% | 0.56% | 0.50% | 0.46% | 0.44% | 0.44% | 0.49% |
| −0.05 | 0.85% | 0.73% | 0.61% | 0.51% | 0.44% | 0.39% | 0.36% | 0.35% | 0.38% | 0.45% | 0.60% |
| −0.04 | 0.61% | 0.50% | 0.40% | 0.34% | 0.27% | 0.26% | 0.26% | 0.29% | 0.39% | 0.60% | 0.80% |
| −0.03 | 0.39% | 0.30% | 0.22% | 0.17% | 0.13% | 0.14% | 0.20% | 0.32% | 0.60% | 0.85% | 1.00% |
| −0.02 | 0.25% | 0.17% | 0.09% | 0.05% | 0.03% | 0.06% | 0.21% | 0.60% | 0.94% | 0.90% | 0.80% |

TABLE 2-continued

| Ratio Error Fluctuation Range | Secondary Coefficient a | | | | | | | | | | |
|---|---|---|---|---|---|---|---|---|---|---|---|
| | −0.0005 | −0.0004 | −0.0003 | −0.0002 | −0.0001 | 0.0000 | 0.0001 | 0.0002 | 0.0003 | 0.0004 | 0.0005 |
| −0.01 | 0.23% | 0.22% | 0.20% | 0.18% | 0.12% | 0.02% | 0.60% | 0.90% | 0.73% | 0.65% | 0.60% |
| 0.00 | 0.40% | 0.40% | 0.41% | 0.41% | 0.42% | 1.00% | 0.42% | 0.41% | 0.41% | 0.40% | 0.40% |
| 0.01 | 0.60% | 0.65% | 0.73% | 0.90% | 0.60% | 0.02% | 0.12% | 0.18% | 0.20% | 0.22% | 0.23% |
| 0.02 | 0.80% | 0.90% | 0.94% | 0.60% | 0.21% | 0.06% | 0.03% | 0.05% | 0.09% | 0.17% | 0.25% |
| 0.03 | 1.00% | 0.85% | 0.60% | 0.32% | 0.20% | 0.14% | 0.13% | 0.17% | 0.22% | 0.30% | 0.39% |
| 0.04 | 0.80% | 0.60% | 0.39% | 0.29% | 0.26% | 0.26% | 0.27% | 0.34% | 0.40% | 0.50% | 0.61% |
| 0.05 | 0.60% | 0.45% | 0.38% | 0.35% | 0.36% | 0.39% | 0.44% | 0.51% | 0.61% | 0.73% | 0.85% |
| 0.06 | 0.49% | 0.44% | 0.44% | 0.46% | 0.50% | 0.56% | 0.64% | 0.73% | 0.86% | 0.98% | 1.12% |

TABLE 3

| | α [°] | Secondary Coefficient a | | | | | | | | | | |
|---|---|---|---|---|---|---|---|---|---|---|---|---|
| | | −0.0005 | −0.0004 | −0.0003 | −0.0002 | −0.0001 | 0 | 0.0001 | 0.0002 | 0.0003 | 0.0004 | 0.0005 |
| Primary Coefficient b | −0.06 | 1.08 | 0.97 | 0.91 | 0.81 | 0.75 | 0.70 | 0.65 | 0.59 | 0.59 | 0.63 | 0.73 |
| | −0.05 | 1.13 | 1.07 | 0.97 | 0.91 | 0.86 | 0.80 | 0.80 | 0.84 | 0.89 | 1.08 | 1.13 |
| | −0.04 | 1.23 | 1.12 | 1.07 | 1.06 | 1.01 | 1.00 | 1.10 | 1.19 | 1.49 | 1.48 | 0.57 |
| | −0.03 | 1.28 | 1.27 | 1.22 | 1.21 | 1.26 | 1.35 | 1.60 | 1.99 | 2.04 | 0.78 | −1.38 |
| | −0.02 | 1.38 | 1.32 | 1.37 | 1.46 | 1.66 | 2.05 | 2.75 | 3.09 | 1.19 | −1.52 | −1.48 |
| | −0.01 | 1.58 | 1.67 | 1.82 | 2.11 | 2.66 | 4.00 | 6.00 | −2.61 | −2.07 | −1.82 | −1.58 |
| | 0.00 | 1.83 | 2.17 | 2.62 | 3.61 | 6.51 | 0.00 | −6.51 | −3.61 | −2.62 | −2.17 | −1.83 |
| | 0.01 | 1.58 | 1.82 | 2.07 | 2.56 | −6.00 | −4.00 | −2.66 | −2.11 | −1.82 | −1.67 | −1.58 |
| | 0.02 | 1.48 | 1.52 | −1.19 | −3.14 | −2.75 | −2.05 | −1.66 | −1.46 | −1.37 | −1.32 | −1.38 |
| | 0.03 | 1.38 | −0.78 | −2.04 | −1.99 | −1.60 | −1.35 | −1.26 | −1.21 | −1.22 | −1.27 | −1.28 |
| | 0.04 | −0.57 | −1.48 | −1.49 | −1.19 | −1.10 | −1.00 | −1.01 | −1.06 | −1.07 | −1.12 | −1.23 |
| | 0.05 | −1.13 | −1.08 | −0.89 | −0.84 | −0.80 | −0.80 | −0.86 | −0.91 | −0.97 | −1.07 | −1.13 |
| | 0.06 | −0.73 | −0.63 | −0.59 | −0.59 | −0.65 | −0.70 | −0.75 | −0.81 | −0.91 | −0.97 | −1.08 |

Tables 2 and 3 show the point-symmetric relation centering on when the coefficient a and the coefficient b are 0. From Table 2, the ratio error fluctuation range has the minimum value when the coefficient a and the coefficient b are respectively −0.0001 and −0.02, and when the coefficient a and the coefficient b are respectively 0.0001 and 0.02. As shown in Table 3, the sign of the rotation angle adjustment amount α° at that time is positive in the former case and negative in the latter case. Since general magnetic garnet has the temperature characteristic of the Faraday rotation angle which is an upward convex curve and in which the rotation angle decreases as the temperature increases, the signs of the coefficient a and the coefficient b are negative. From the above, in order to reduce the ratio error fluctuation range, it is understood that the coefficient a and the coefficient b of the temperature characteristic of the rotation angle of magnetic garnet are respectively close to −0.0001 and −0.02. In this case, the rotation angle adjustment amount α° becomes about 1.66°.

Figure 15:
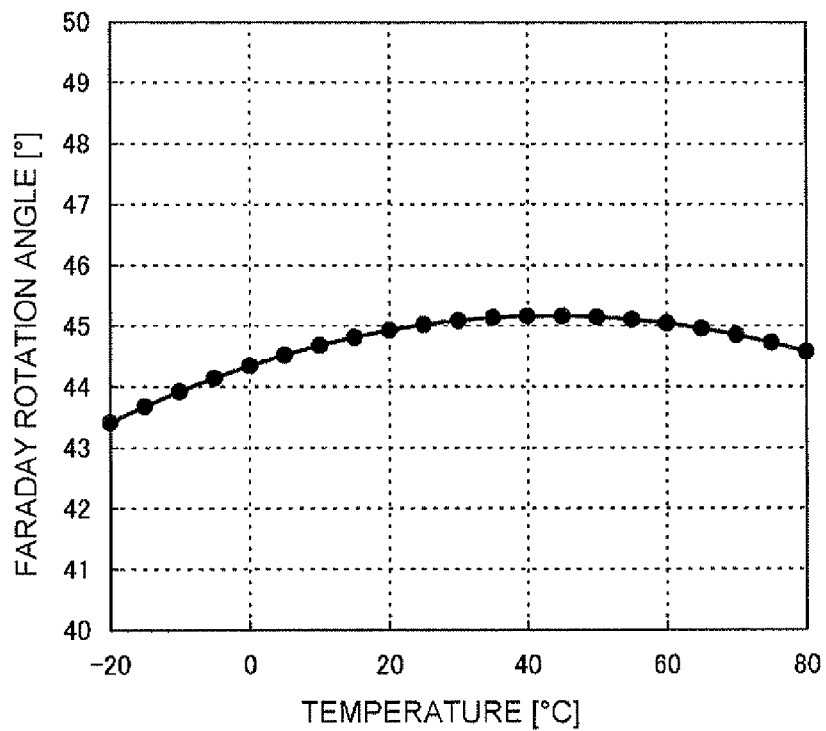
FIG. 15 is a graph illustrating an example of the temperature characteristic of the Faraday rotation angle of a Faraday element 19a in Example 2 of the electric current measuring apparatus of the invention.
Figure 16:
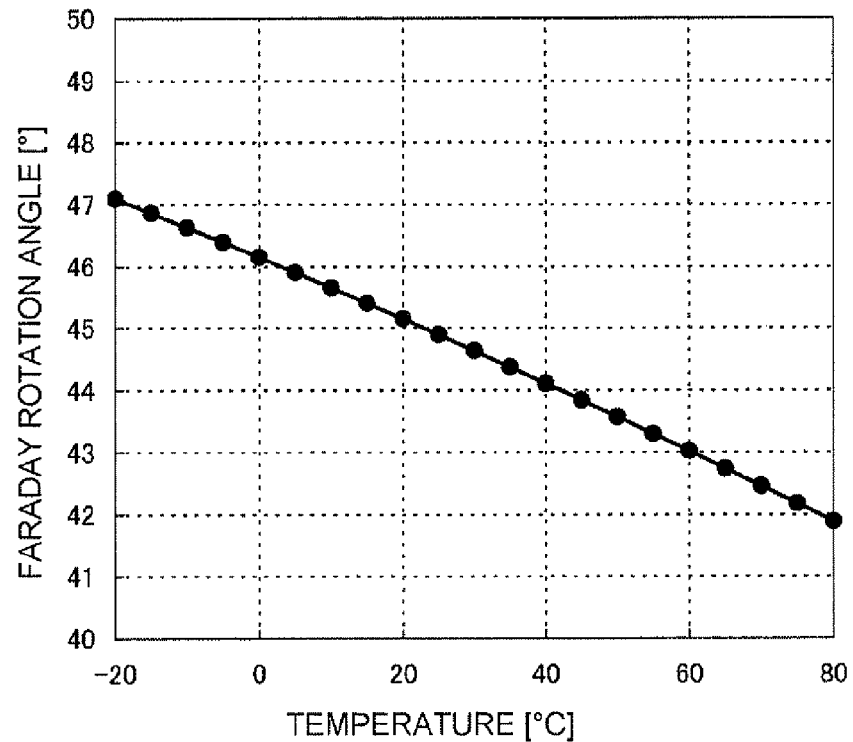
FIG. 16 is a graph illustrating an example of the temperature characteristic of the Faraday rotation angle of a Faraday element 19b in Example 2 of the electric current measuring apparatus of the invention.

In order to realize the coefficients a and b for reduction of the ratio error fluctuation range, Example in which the two Faraday elements 19a and 19b shown in FIG. 9 are provided will be described. Magnetic garnet having temperature dependency in a quadratic curve shape was used as the Faraday element 19a of FIG. 9, and magnetic garnet shown in FIG. 16 was used as the Faraday element 19b. The temperature dependencies of the Faraday elements 19a and 19b having the Faraday rotation angle of 45° at the temperature of 23° C. are shown in FIGS. 15 and 16.

Figure 17:
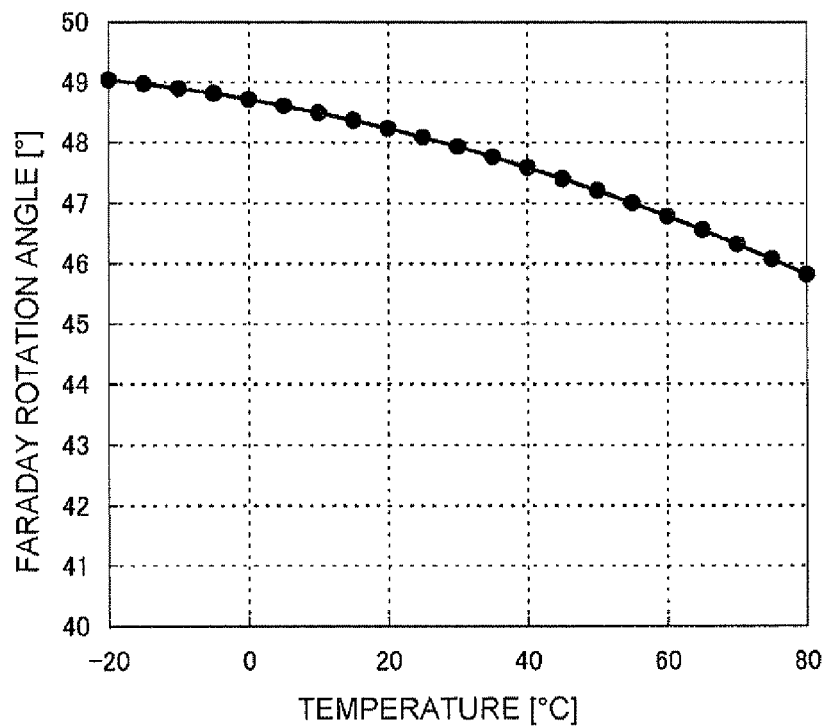
FIG. 17 is a graph illustrating an example of the temperature characteristic of the total Faraday rotation angle of the Faraday elements 19a and 19b in Example 2 of the electric current measuring apparatus of the invention.

As a result of optimizing the thickness of each of the Faraday elements 19a and 19b, a Faraday element having temperature dependency expressed by Equation 2 at the time of reciprocation was obtained. The rotation angles of the Faraday element 19a and the Faraday element 19b at the temperature of 23° C. at the time of magnetic saturation are respectively 8.34° and 15.73°, that is, the total Faraday rotation angle of 24.07° is obtained, and α=1.57°. The total Faraday rotation angle at the temperature of 23° C. at the time of magnetic saturation when linearly polarized light LO and LR transmit in a reciprocating manner becomes 48.14°. FIG. 17 shows the temperature dependency of the total Faraday rotation angle at the time of reciprocation.

$$\theta_F = -2.02 \cdot 10^{-4} \cdot T^2 - 0.0200 \cdot T + 48.71 \quad \text{[Equation 2]}$$

in which T is temperature [° C.].

Figure 18:
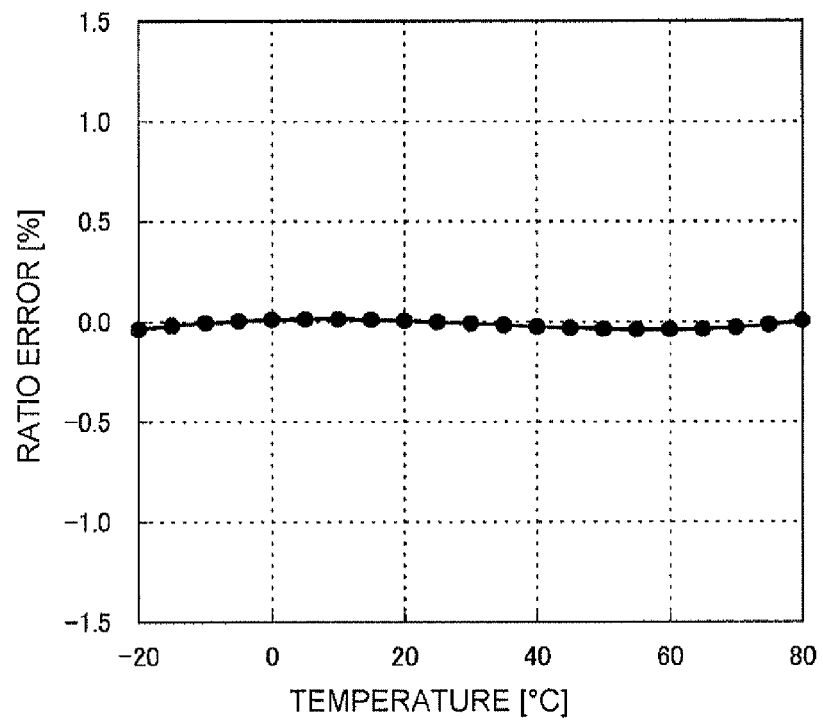
FIG. 18 is a graph illustrating the temperature characteristic of the ratio error in Example 2 of the electric current measuring apparatus of the invention.

Table 4 and FIG. 18 show the temperature characteristic of the ratio error in the measurement value of the electric current I to be measured output from the signal processing circuit of the electric current measuring apparatus 20.

TABLE 4

| Temperature T [° C.] | Rotation Angle [deg] | Ratio Error [%] |
|---|---|---|
| −20 | 49.03 | −0.04 |
| −15 | 48.97 | −0.02 |
| −10 | 48.89 | −0.01 |
| −5 | 48.81 | 0.00 |
| 0 | 48.71 | 0.01 |
| 5 | 48.61 | 0.01 |
| 10 | 48.49 | 0.01 |
| 15 | 48.37 | 0.01 |
| 20 | 48.23 | 0.00 |
| 25 | 48.09 | 0.00 |
| 30 | 47.93 | −0.01 |
| 35 | 47.77 | −0.02 |
| 40 | 47.59 | −0.03 |
| 45 | 47.40 | −0.03 |
| 50 | 47.21 | −0.04 |
| 55 | 47.00 | −0.04 |
| 60 | 46.79 | −0.04 |
| 65 | 46.56 | −0.04 |
| 70 | 46.32 | −0.03 |

TABLE 4-continued

| Temperature T [° C.] | Rotation Angle [deg] | Ratio Error [%] |
|---|---|---|
| 75 | 46.08 | −0.02 |
| 80 | 45.82 | 0.00 |

From Table 4 and FIG. 18, when the two Faraday elements 19a and 19b were provided and α=1.57° was set, the ratio error could fall within −0.04 to 0.01 from 23° C. That is, the fluctuation range of the ratio error falls within 0.05% through the temperature range between −20° C. or higher and 80° C. or lower.

EXAMPLE 3

Figure 19:
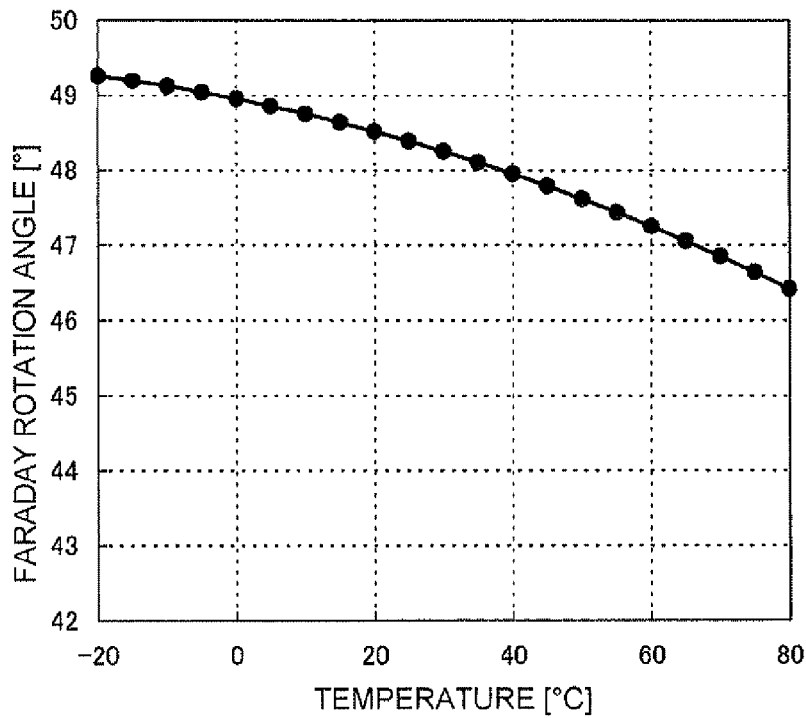
FIG. 19 is a graph illustrating the temperature characteristic of the Faraday rotation angle of a Faraday rotator which is used as a first Faraday rotator in Example 3 of the electric current measuring apparatus of the invention.

Magnetic garnet was developed on the basis of the study result of Table 2 such that the radio error could be reduced using a single Faraday rotator. As a result, magnetic garnet having temperature dependency expressed by Equation 3 was obtained. The Faraday rotation angle at the temperature of 23° C. was 24.22°, that is, α=1.72° was set. FIG. 19 shows the temperature dependency of the obtained magnetic garnet.

$$\theta_F = -1.64 \cdot 10^{-4} \cdot T^2 - 0.0185 \cdot T + 48.95 \quad \text{[Equation 3]}$$

in which T is temperature [° C.]

The total Faraday rotation angle at the time of magnetic saturation when linearly polarized light LO and LR transmit in a reciprocating manner becomes 48.44°. Table 5 and FIG. 20 show the temperature-ratio error characteristic in the measurement value of the electric current I to be measured output from the signal processing circuit of the electric current measuring apparatus 1 having the first Faraday rotator 7.

TABLE 5

| Temperature T [° C.] | Rotation Angle [deg] | Ratio Error [%] |
|---|---|---|
| −20 | 49.26 | −0.05 |
| −15 | 49.19 | −0.03 |
| −10 | 49.12 | −0.02 |
| −5 | 49.04 | −0.01 |
| 0 | 48.95 | 0.00 |
| 5 | 48.86 | 0.01 |
| 10 | 48.75 | 0.01 |
| 15 | 48.64 | 0.01 |
| 20 | 48.52 | 0.00 |
| 25 | 48.39 | 0.00 |
| 30 | 48.25 | −0.01 |
| 35 | 48.10 | −0.01 |
| 40 | 47.95 | −0.02 |
| 45 | 47.79 | −0.03 |
| 50 | 47.62 | −0.04 |
| 55 | 47.44 | −0.04 |
| 60 | 47.25 | −0.04 |
| 65 | 47.06 | −0.05 |
| 70 | 46.85 | −0.04 |
| 75 | 46.64 | −0.04 |
| 80 | 46.42 | −0.03 |

Figure 20:
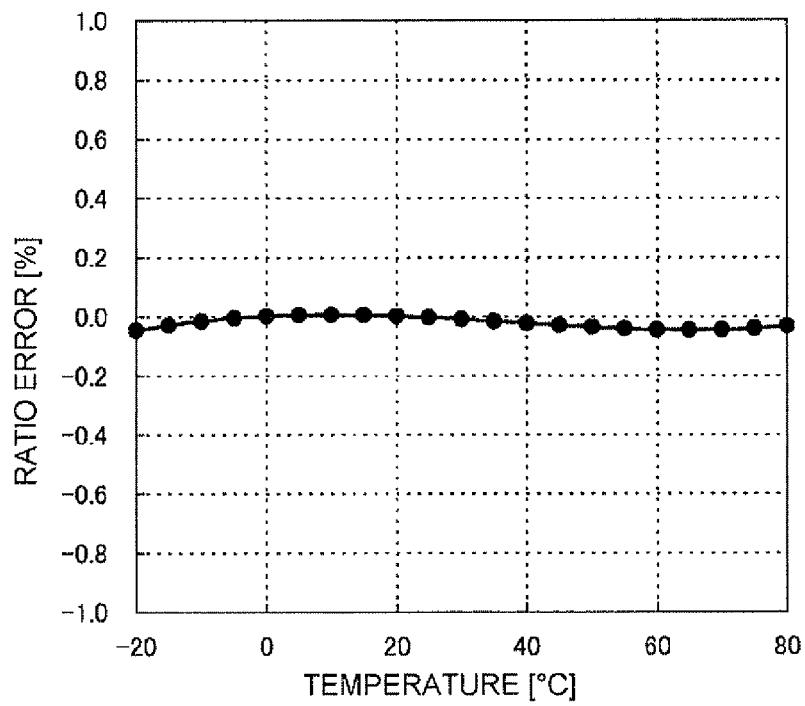
FIG. 20 is a graph illustrating the temperature characteristic of the ratio error in Example 3 of the electric current measuring apparatus of the invention.

From Table 5 and FIG. 20, the ratio error range is −0.05 to 0.01%, and the fluctuation range of the ratio error falls within 0.06% through the temperature range between −20° C. or higher and 80° C. or lower. It was possible to realize the same performance as the single Faraday rotator compared to Example 2.

As described above, according to the electric current measuring apparatus of the invention, the rotation angle of the Faraday rotator changes by α° from 22.5° at the temperature of 23° C., thereby suppressing the fluctuation range of the ratio error in the measurement value of the measured electric current output from the signal processing circuit of the electric current measuring apparatus to be within ±0.5% through the temperature range between −20° C. or higher 80° C. or lower. Therefore, it becomes possible to compensate for the temperature characteristic of the ratio error in the measurement value in an optical system, called a Faraday rotator, thereby improving the reliability of the electric current measuring apparatus and suppressing the fluctuation range of the ratio error to be within ±0.5%. As a result, it is possible to realize an electric current measuring apparatus which can be applied to a protection relay.

The fluctuation range of the ratio error in the measurement value of the measured electric current is suppressed to be within ±0.2% through the temperature range between −20° C. or higher and 80° C. or lower, thereby making it possible to use an electric current measuring apparatus for the purpose of requiring the temperature characteristic of the ratio error within ±0.2% (for example, an electric energy meter for measuring an electric rate which requires strict measurement).

When a lead-glass fiber is used as the optical fiber for a sensor, after the temperature characteristic of the ratio error of the lead-glass fiber is added, the rotation angle α° of the Faraday rotator is adjusted. With the electric current measuring apparatus configured as above, even when a lead-glass fiber is used as the optical fiber for a sensor, it becomes possible to suppress the fluctuation range of the ratio error in the measurement value of the measured electric current output from the signal processing circuit to be within ±0.5% (or ±0.2) through the temperature range between −20° C. or higher and 80° C. or lower.

The invention may be modified in various ways on the basis of the technical spirit, and for example, the optical fiber 2 for a sensor may be a quartz glass fiber. The first optical fiber 9 may be changed to a single-mode optical fiber, and the polarization separating prism 15 may be changed to a polarization-dependent/independent circulator.

EXPLANATION OF REFERENCE NUMERALS 1 and 20: electric current measuring apparatus
2: optical fiber for sensor
3: optical circuit unit
4: photoelectric conversion unit
5: electrical conductor
6: reflecting film
7: first Faraday rotator
7a and 18a: permanent magnet
8: polarized light separator
9: first optical fiber
9a: end surface of first optical fiber
9b: other end of first optical fiber 9
10: second optical fiber
10a: end surface of second optical fiber
11 and 14: lens
12: ferrule
13: light source
15: polarization separating prism
16: first photoelectric conversion element
17; second photoelectric conversion element
18: second Faraday rotator
19a and 19b: Faraday element
LO and LR: linearly polarized light
L1: ordinary ray
L2: extraordinary ray
I: measured electric current

The invention claimed is:

1. An electric current measuring apparatus comprising:

a signal processing circuit which includes at least an optical fiber for a sensor, a polarization separating unit, a Faraday rotator, a light source, and a photoelectric conversion element, wherein the optical fiber for a sensor is provided around the periphery of an electrical conductor through which an electric current to be measured flows, and has one end at which linearly polarized light is incident and the other end at which the incident linearly polarized light is reflected, the polarization separating unit is provided at one end of the optical fiber for a sensor, the Faraday rotator is disposed between one end of the optical fiber for a sensor and the polarization separating unit, and the Faraday rotation angle of the Faraday rotator at the time of magnetic saturation is set to degrees of $22.5°+α°$ at a temperature of 23° C., a curve of temperature characteristics of a ratio error in a measurement value of an electric current to be measured, output from the signal processing circuit is shifted to a high-temperature side by adjusting the Faraday rotation angle, such that the fluctuation range of the ratio error in the measured value of a measured electric current output from the signal processing circuit is set within a range of ±0.5%, and a temperature range, in which the fluctuation range is set within a range of ±0.5%, is 100 degrees in the Celsius scale.

2. The electric current measuring apparatus according to claim 1, wherein the temperature range of 100 degrees in the Celsius scale is between −20° C. or higher and 80° C. or lower.

3. The electric current measuring apparatus according to claim 1, wherein the Faraday rotator has the temperature characteristic of the Faraday rotation angle such that the Faraday rotation angle at the time of magnetic saturation changes in a quadratic curve shape in accordance with a change in temperature.

4. The electric current measuring apparatus according to claim 3, wherein the fluctuation range of the ratio error in the measurement value of the measured electric current output from the signal processing circuit is set within a range of ±0.2%.

5. The electric current measuring apparatus according to claim 4, wherein a temperature range in which the fluctuation range is set within a range of ±0.2% is 100 degrees in the Celsius scale.

6. The electric current measuring apparatus according to claim 5, wherein the temperature range of 100 degrees in the Celsius scale is between −20° C. or higher and 80° C. or lower.

7. The electric current measuring apparatus according to claim 1, wherein the Faraday rotator has two or more Faraday elements.

8. The electric current measuring apparatus according to claim 7, wherein the Faraday rotation angles of the two or more Faraday elements are different from each other.

9. The electric current measuring apparatus according to claim 1, wherein the optical fiber for a sensor is a lead-glass fiber.

* * * * *

UNITED STATES PATENT AND TRADEMARK OFFICE
CERTIFICATE OF CORRECTION

PATENT NO.       : 8,957,667 B2
APPLICATION NO.  : 13/321396
DATED            : February 17, 2015
INVENTOR(S)      : Yoshihiro Konno et al.

It is certified that error appears in the above-identified patent and that said Letters Patent is hereby corrected as shown below:

In the Claims

In Col. 19, line 27, claim 1, "in the measured value" should be --in the measurement value--.

In Col. 19, line 28, claim 1, "a measured electric current" should be --the measured electric current--.

Signed and Sealed this
Twenty-sixth Day of May, 2015

Michelle K. Lee
*Director of the United States Patent and Trademark Office*